United States Patent
Yim et al.

(10) Patent No.: US 10,950,709 B2
(45) Date of Patent: Mar. 16, 2021

(54) SEMICONDUCTOR DEVICE

(71) Applicant: SAMSUNG ELECTRONICS CO., LTD., Suwon-si (KR)

(72) Inventors: Jeonghyuk Yim, Seoul (KR); Wandon Kim, Seongnam-si (KR); Weonhong Kim, Suwon-si (KR); Jongho Park, Suwon-si (KR); Hyeonjun Baek, Hwaseong-si (KR); Byounghoon Lee, Suwon-si (KR); Sangjin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/458,412

(22) Filed: Jul. 1, 2019

(65) Prior Publication Data

US 2020/0013898 A1 Jan. 9, 2020

(30) Foreign Application Priority Data

Jul. 6, 2018 (KR) .................. 10-2018-0078865
Jan. 15, 2019 (KR) .................. 10-2019-0005362

(51) Int. Cl.
*H01L 29/78* (2006.01)
*H01L 27/092* (2006.01)
(Continued)

(52) U.S. Cl.
CPC ...... *H01L 29/516* (2013.01); *H01L 21/28088* (2013.01); *H01L 21/823814* (2013.01);
(Continued)

(58) Field of Classification Search
CPC .............. H01L 29/516; H01L 29/0673; H01L 29/0847; H01L 29/42392; H01L 29/4908; H01L 29/4966; H01L 29/6684; H01L 29/7851; H01L 29/78696; H01L 29/7848; H01L 21/28088; H01L 21/823814; H01L 21/823842; H01L 21/823821; H01L 21/823857; H01L 27/0922; H01L 27/0924
(Continued)

(56) References Cited

U.S. PATENT DOCUMENTS 6,605,839 B2   8/2003  Miura et al.
9,041,082 B2   5/2015  Dubourdieu et al.
(Continued)

*Primary Examiner* — Tong-Ho Kim
(74) *Attorney, Agent, or Firm* — F. Chau & Associates, LLC

(57) ABSTRACT

A semiconductor device includes a substrate including first and second active regions, first and second active patterns disposed on the first and second active regions, respectively, first and second gate electrodes crossing the first and second active patterns, respectively, a first gate insulating pattern interposed between the first active pattern and the first gate electrode, and a second gate insulating pattern interposed between the second active pattern and the second gate electrode. The first gate insulating pattern includes a first dielectric pattern and a first ferroelectric pattern disposed on the first dielectric pattern. The second gate insulating pattern includes a second dielectric pattern. A threshold voltage of a transistor in the first active region is different from a threshold voltage of a transistor in the second active region.

19 Claims, 29 Drawing Sheets

(51) Int. Cl.
  *H01L 29/06* (2006.01)
  *H01L 29/423* (2006.01)
  *H01L 29/49* (2006.01)
  *H01L 29/786* (2006.01)
  *H01L 29/51* (2006.01)
  *H01L 21/28* (2006.01)
  *H01L 29/66* (2006.01)
  *H01L 21/8238* (2006.01)
  *H01L 29/08* (2006.01)

(52) U.S. Cl.
  CPC ........ *H01L 21/823821* (2013.01); *H01L 21/823842* (2013.01); *H01L 21/823857* (2013.01); *H01L 27/0922* (2013.01); *H01L 27/0924* (2013.01); *H01L 29/0673* (2013.01); *H01L 29/0847* (2013.01); *H01L 29/42392* (2013.01); *H01L 29/4908* (2013.01); *H01L 29/4966* (2013.01); *H01L 29/6684* (2013.01); *H01L 29/7851* (2013.01); *H01L 29/78696* (2013.01); *H01L 29/7848* (2013.01)

(58) Field of Classification Search
  USPC .......................................................... 257/295
  See application file for complete search history.

(56) References Cited

U.S. PATENT DOCUMENTS

| | | | |
|---|---|---|---|
| 9,305,928 | B2 | 4/2016 | Kim et al. |
| 9,349,842 | B2 | 5/2016 | Schloesser et al. |
| 9,780,183 | B2 | 10/2017 | Kim et al. |
| 2018/0151576 | A1* | 5/2018 | Lee ............. H01L 23/5226 |
| 2018/0151745 | A1 | 5/2018 | Chang et al. |
| 2018/0182860 | A1* | 6/2018 | Lee ............. H01L 27/092 |

* cited by examiner

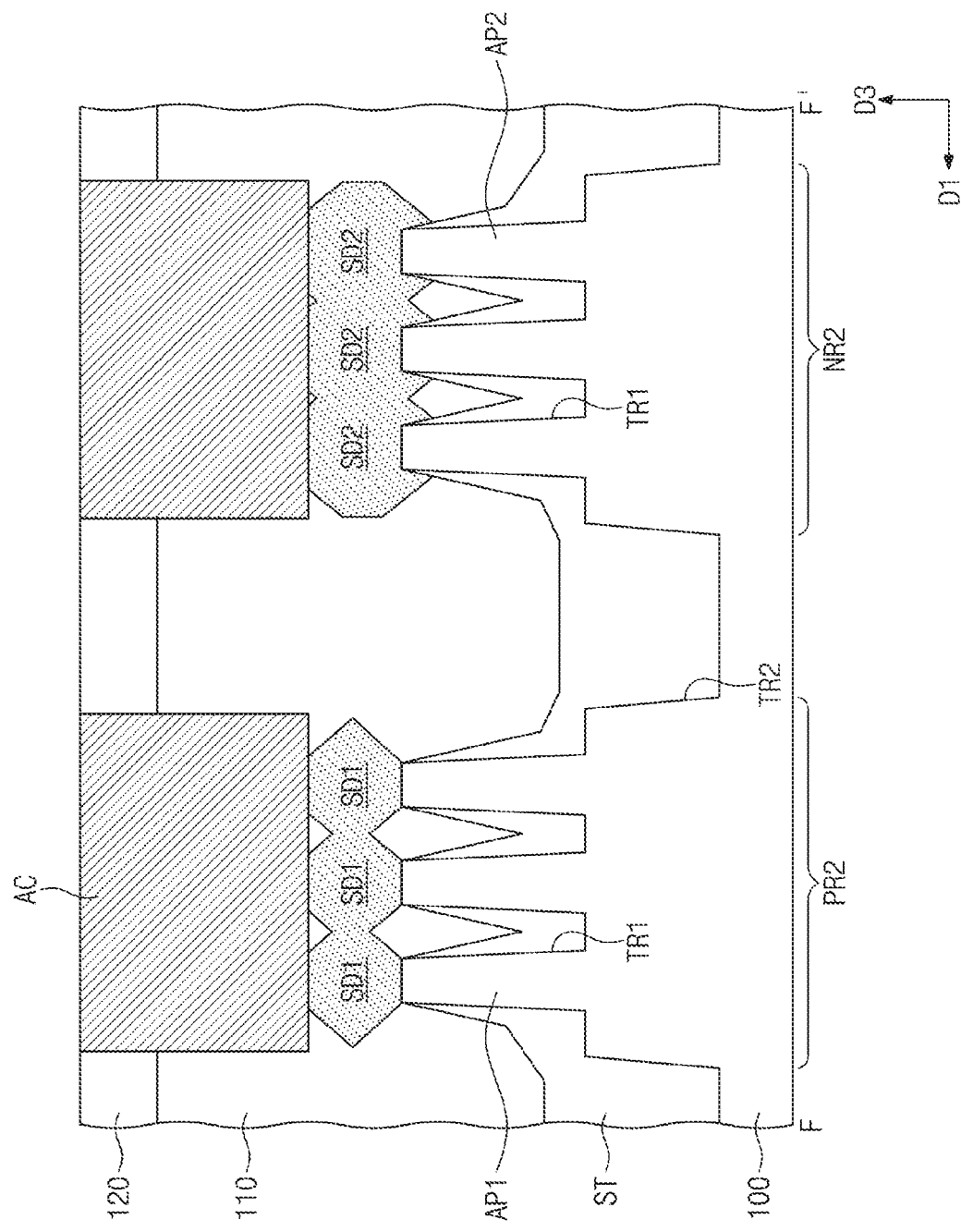

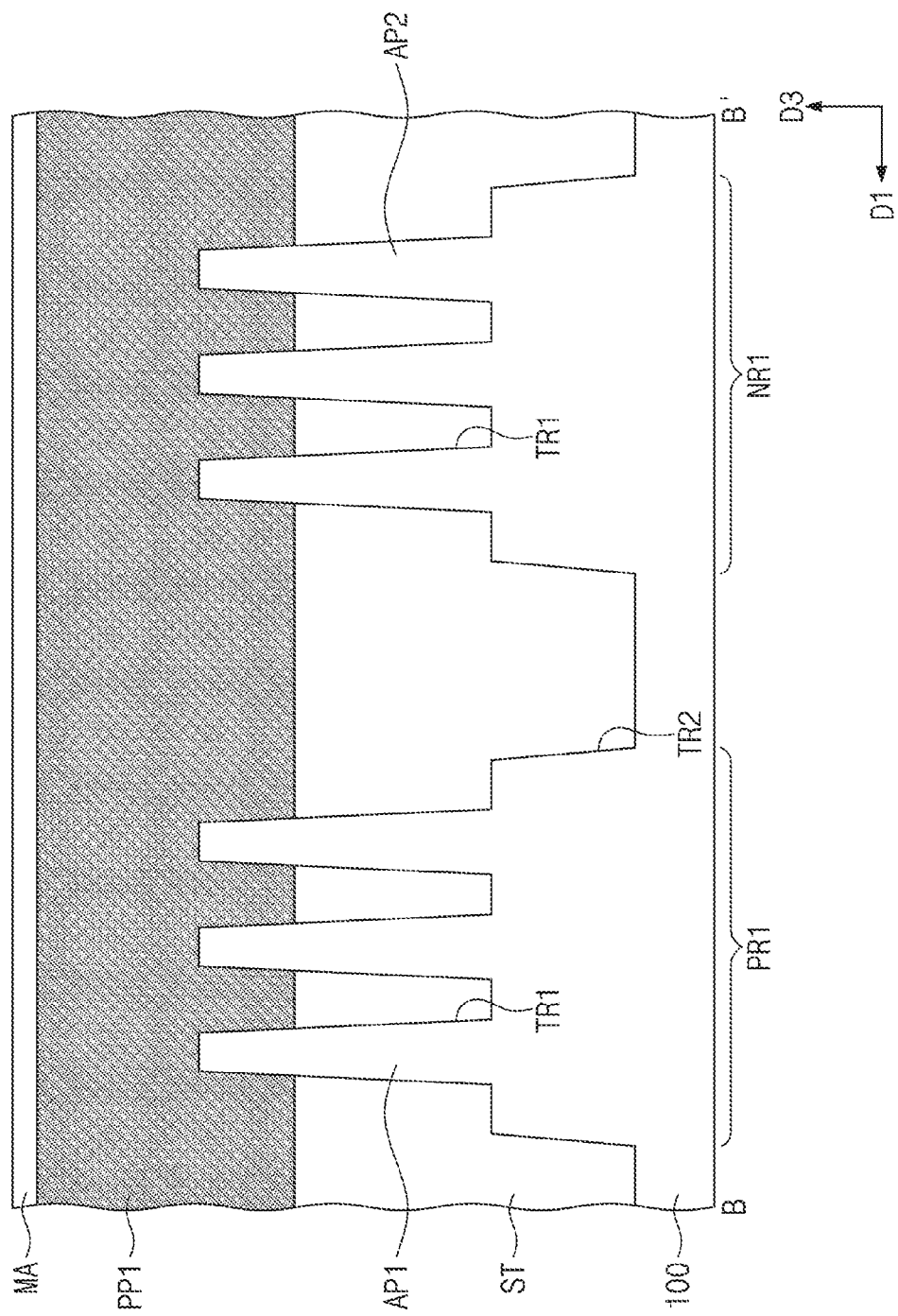

SEMICONDUCTOR DEVICE

CROSS-REFERENCE TO RELATED APPLICATIONS

This U.S. non-provisional patent application claims priority under 35 U.S.C. § 119 to Korean Patent Application No's. 10-2018-0078865 and 10-2019-0005362, filed on Jul. 6, 2018 and Jan. 15, 2019, respectively, in the Korean Intellectual Property Office, the disclosures of which are hereby incorporated by reference in their entireties.

TECHNICAL FIELD

Exemplary embodiments of the present inventive concept relate to a semiconductor device, and more particularly, to a semiconductor device including a field effect transistor and a method of fabricating the same.

DISCUSSION OF THE RELATED ART

A semiconductor device includes an integrated circuit including metal-oxide-semiconductor field-effect transistors (MOSFETs). To meet an increasing demand for a semiconductor device with a small pattern size and a reduced design rule, the MOSFETs may be scaled down. However, scaling down the MOSFETs may lead to deterioration in operational properties of the semiconductor device.

SUMMARY

An exemplary embodiment of the inventive concept provides a semiconductor device including transistors having different threshold voltages.

According to an exemplary embodiment of the inventive concept, a semiconductor device includes a substrate including a first active region and a second active region, a first active pattern and a second active pattern disposed in the first and second active regions, respectively, a first gate electrode and a second gate electrode crossing the first and second active patterns, respectively, and a first gate insulating pattern interposed between the first active pattern and the first gate electrode and a second gate insulating pattern interposed between the second active pattern and the second gate electrode. The first gate insulating pattern includes a first dielectric pattern and a first ferroelectric pattern disposed on the first dielectric pattern, and the second gate insulating pattern includes a second dielectric pattern. A threshold voltage of a transistor in the first active region is different from a threshold voltage of a transistor in the second active region.

According to an exemplary embodiment of the inventive concept, a semiconductor device includes a substrate including a first active region and a second active region, a first active pattern and a second active pattern disposed in the first and second active regions, respectively, a first gate electrode and a second gate electrode crossing the first and second active patterns, respectively, and a first gate insulating pattern interposed between the first active pattern and the first gate electrode and a second gate insulating pattern interposed between the second active pattern and the second gate electrode. The first gate insulating pattern includes a first dielectric pattern and a first ferroelectric pattern disposed on the first dielectric pattern, and the second gate insulating pattern includes a second dielectric pattern and a second ferroelectric pattern disposed on the second dielectric pattern. At least one of a ferroelectric material, an impurity concentration, and a thickness of the first ferroelectric pattern is different from at least one of a ferroelectric material, an impurity concentration, and a thickness of the second ferroelectric pattern.

According to an exemplary embodiment of the inventive concept, a semiconductor device includes a substrate including a first active region and a second active region, a first active pattern and a second active pattern disposed in the first and second active regions, respectively, a first gate electrode and a second gate electrode crossing the first and second active patterns, respectively, a gate spacer disposed on a side surface of each of the first and second gate electrodes, a first dielectric pattern and a first ferroelectric pattern interposed between the first gate electrode and the gate spacer, and a second dielectric pattern interposed between the second gate electrode and the gate spacer.

BRIEF DESCRIPTION OF THE DRAWINGS

The above and other features of the present inventive concept will become more apparent by describing in detail exemplary embodiments thereof with reference to the accompanying drawings, in which:

FIG. 2D is a cross-sectional view taken along line F-F' of FIG. 1.

FIGS. 6B and 8B are cross-sectional views taken along line B-B' of FIGS. 5, 7, and 9, respectively.

DETAILED DESCRIPTION

Figure 1:
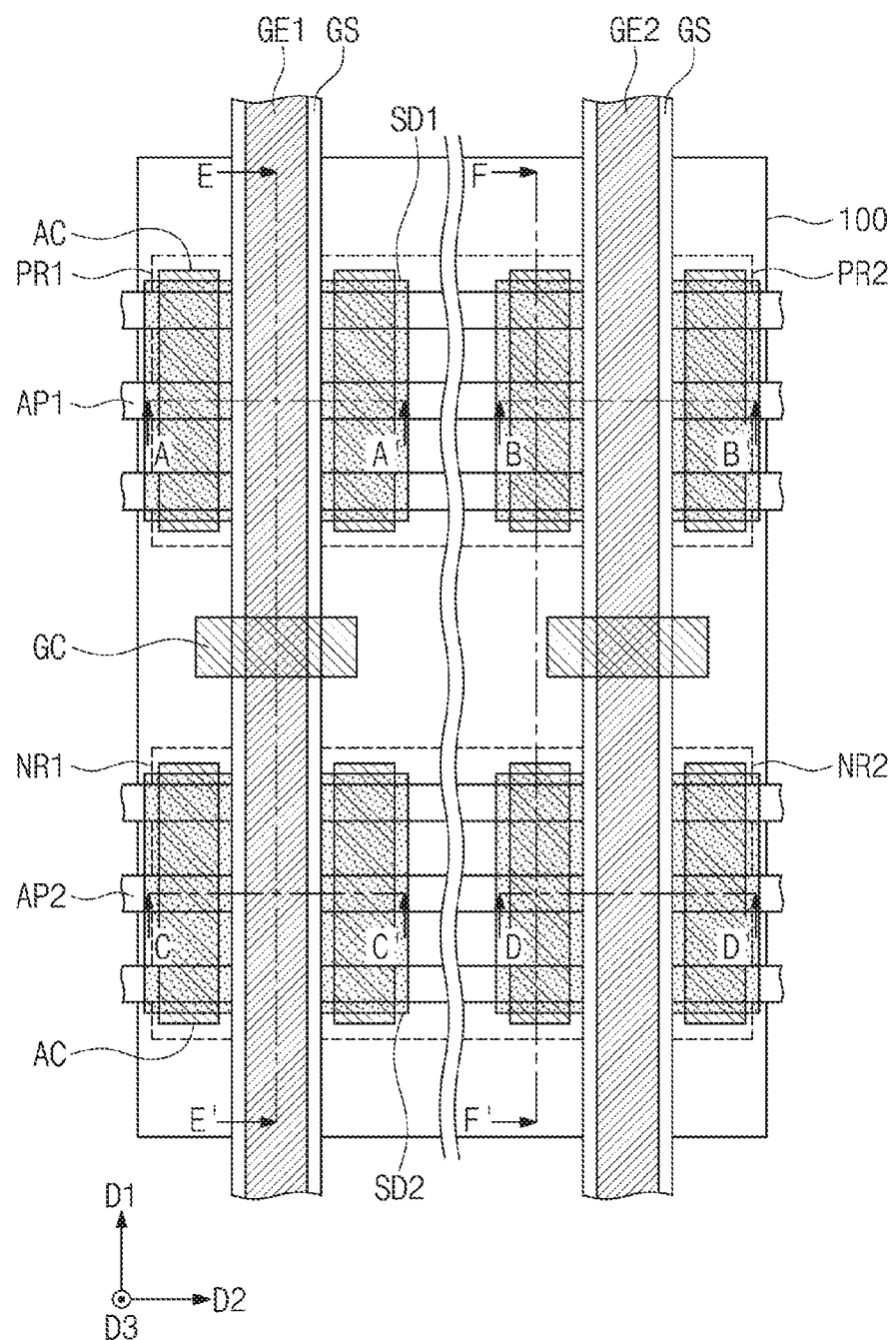
FIG. 1 is a plan view illustrating a semiconductor device according to an exemplary embodiment of the inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present. In addition, it will also be understood that when an element is referred to as "covering" another element, it can be the only element covering the other element, or one or more intervening elements may also be covering the other element.

Figure 2A:
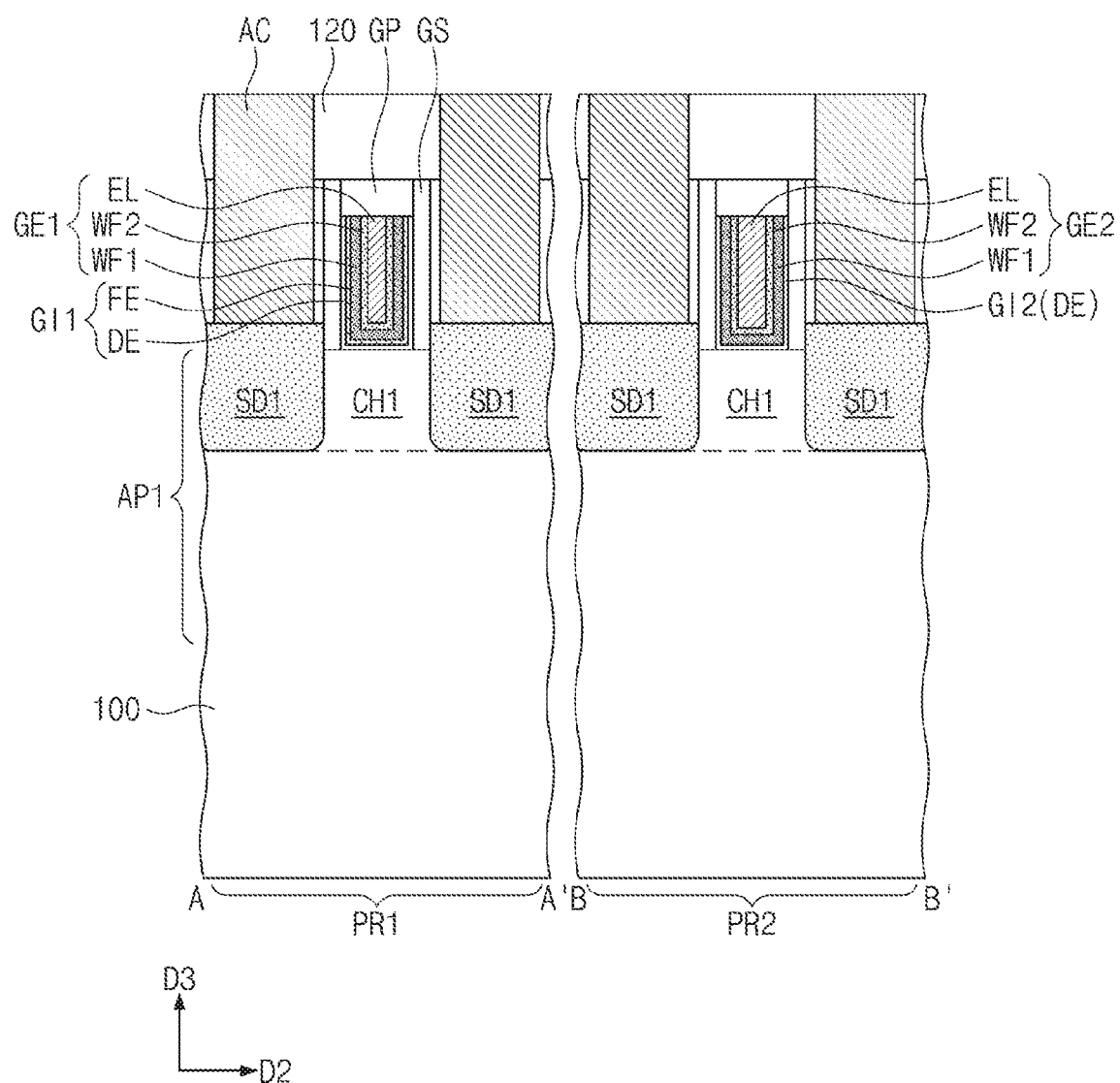
FIG. 2A is a cross-sectional view taken along lines A-A' and B-B' of FIG. 1.
Figure 2B:
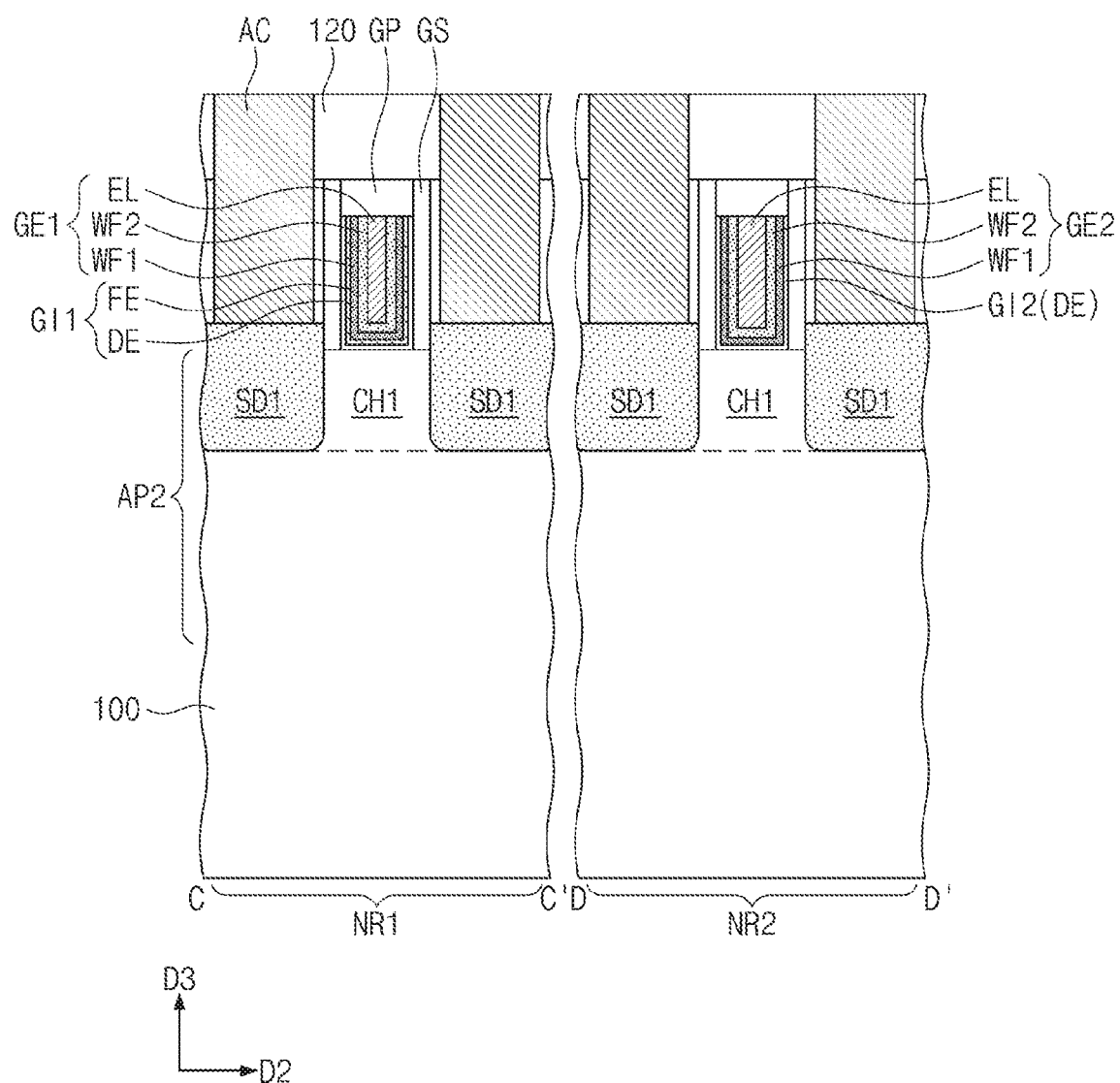
FIG. 2B is a cross-sectional view taken along lines C-C' and D-D' of FIG. 1.
Figure 2C:
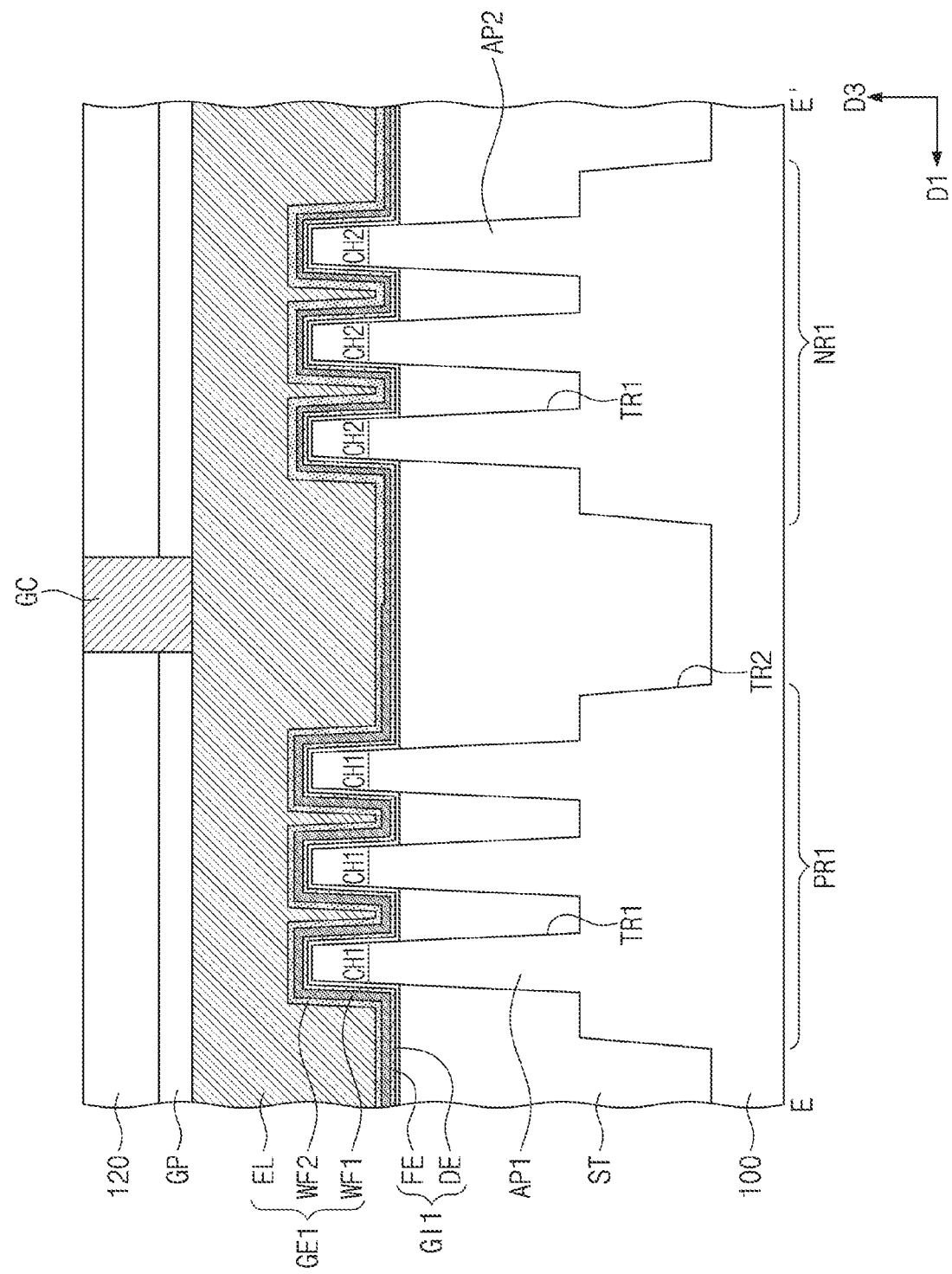
FIG. 2C is a cross-sectional view taken along line E-E' of FIG. 1.

FIG. 1 is a plan view illustrating a semiconductor device according to an exemplary embodiment of the inventive concept. FIG. 2A is a cross-sectional view taken along lines A-A' and B-B' of FIG. 1. FIG. 2B is a cross-sectional view taken along lines C-C' and D-D' of FIG. 1. FIG. 2C is a cross-sectional view taken along line E-E' of FIG. 1. FIG. 2D is a cross-sectional view taken along line F-F' of FIG. 1.

Referring to FIG. 1 and FIGS. 2A to 2D, a substrate 100 including a first PMOSFET region PR1, a second PMOSFET region PR2, a first NMOSFET region NR1, and a second NMOSFET region NR2 may be provided. The substrate 100 may be a semiconductor substrate (e.g., of silicon, germanium, or silicon-germanium) or a compound semiconductor substrate. As an example, the substrate 100 may be a silicon wafer.

In an exemplary embodiment, each of the first and second PMOSFET regions PR1 and PR2 and the first and second NMOSFET regions NR1 and NR2 may be a logic cell region on which logic transistors constituting a logic circuit of the semiconductor device are integrated. As an example, logic transistors constituting the logic circuit may be disposed in the logic cell region of the substrate 100. The first and second PMOSFET regions PR1 and PR2 and the first and second NMOSFET regions NR1 and NR2 may include some of the logic transistors.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

A second trench TR2 may be formed in an upper portion of the substrate 100 to define the first and second PMOSFET regions PR1 and PR2 and the first and second NMOSFET regions NR1 and NR2. The second trench TR2 may be located between the first PMOSFET region PR1 and the first NMOSFET region NR1 and between the second PMOSFET region PR2 and the second NMOSFET region NR2. The first PMOSFET region PR1 and the first NMOSFET region NR1 may be spaced apart from each other in a first direction D1 with the second trench TR2 interposed therebetween. The second PMOSFET region PR2 and the second NMOSFET region NR2 may be spaced apart from each other in the first direction D1 with the second trench TR2 interposed therebetween. The first PMOSFET region PR1 and the second PMOSFET region PR2 may be spaced apart from each other in a second direction D2. The first NMOSFET region NR1 and the second NMOSFET region NR2 may be spaced apart from each other in the second direction D2.

First active patterns AP1 may be provided on the first and second PMOSFET regions PR1 and PR2. Second active patterns AP2 may be provided on the first and second NMOSFET regions NR1 and NR2. The first and second PMOSFET regions PR1 and PR2 and the first and second NMOSFET regions NR1 and NR2 may also be referred to herein as active regions.

Thus, the first and second active patterns AP1 and AP2 may be described as being disposed in active regions. The first and second active patterns AP1 and AP2 may extend in the second direction D2. The first and second active patterns AP1 and AP2 may be portions of the substrate 100 which have a vertically protruding shape. A first trench TR1 may be defined between adjacent ones of the first active patterns AP1 and between adjacent ones of the second active patterns AP2. The first trench TR1 may be shallower than the second trench TR2.

A device isolation layer ST may be provided to fill the first and second trenches TR1 and TR2. The device isolation layer ST may include, for example, a silicon oxide layer. Upper portions of the first and second active patterns AP1 and AP2 may have a shape vertically protruding above the device isolation layer ST (e.g., see FIG. 2C). Each of the upper portions of the first and second active patterns AP1 and AP2 may have a fin shape. In an exemplary embodiment, the device isolation layer ST does not cover the upper portions of the first and second active patterns AP1 and AP2. The device isolation layer ST may cover lower side surfaces of the first and second active patterns AP1 and AP2.

First source/drain patterns SD1 may be provided on the upper portions of the first active patterns AP1. The first source/drain patterns SD1 may be impurity regions of a first conductivity type (e.g., p-type). A first channel region CH1 may be interposed between each pair of the first source/drain patterns SD1. Second source/drain patterns SD2 may be provided on the upper portions of the second active patterns AP2. The second source/drain patterns SD2 may be impurity regions of a second conductivity type (e.g., n-type). A second channel region CH2 may be interposed between each pair of the second source/drain patterns SD2.

In an exemplary embodiment, the first source/drain patterns SD1 may have p-type conductivity and the second source/drain patterns SD2 may have n-type conductivity. In another exemplary embodiment, the first source/drain patterns SD1 may have n-type conductivity and the second source/drain patterns SD2 may have p-type conductivity.

The first and second source/drain patterns SD1 and SD2 may be epitaxial patterns that are formed by a selective epitaxial growth process. The first and second source/drain patterns SD1 and SD2 may have top surfaces that are positioned at a higher level than those of the first and second channel regions CH1 and CH2. For example, as shown in FIGS. 2A and 2B, in an exemplary embodiment, a distance from the top surface of the substrate 100 to the top surfaces of the first source/drain patterns SD1 may be greater than a distance from the top surface of the substrate 100 to the top surface of the first channel regions CH1. A similar spatial relationship may exist between the second source/drain regions SD2 and the second channel regions CH2. In an exemplary embodiment, the first source/drain patterns SD1 may include a semiconductor material (e.g., SiGe) having a lattice constant greater than that of the semiconductor substrate 100. In this case, the first source/drain patterns SD1 may exert a compressive stress to the first channel regions CH1. In an exemplary embodiment, the second source/drain patterns SD2 may include the same semiconductor material (e.g., Si) as that of the substrate 100.

A first gate electrode GE1 and a second gate electrode GE2 may be provided to cross the first and second active patterns AP1 and AP2 and to extend in the first direction D1. For example, as shown in FIG. 1, the first and second active patterns AP1 and AP2 may extend lengthwise in the second direction D2, and the first gate electrode GE1 and the second gate electrode GE2 may extend lengthwise in the first direction D1 such that they cross the first and second active patterns AP1 and AP2. The first gate electrode GE1 may cross over the first PMOSFET region PR1 and the first NMOSFET region NR1. The second gate electrode GE2 may cross over the second PMOSFET region PR2 and the second NMOSFET region NR2. The first gate electrode GE1 and the second gate electrode GE2 may be spaced apart from each other in the second direction D2.

Each of the first and second gate electrodes GE1 and GE2 may be vertically overlapped with the first and second channel regions CH1 and CH2. Each of the first and second gate electrodes GE1 and GE2 may be provided to face a top surface and opposite side surfaces of each of the first and second channel regions CH1 and CH2 (e.g., see FIG. 2C).

A pair of gate spacers GS may be respectively disposed on opposite side surfaces of each of the first and second gate electrodes GE1 and GE2. The gate spacers GS may extend along the first and second gate electrodes GE1 and GE2 and in the first direction D1. Top surfaces of the gate spacers GS may be higher than top surfaces of the first and second gate electrodes GE1 and GE2. For example, in an exemplary embodiment, a distance between the top surfaces of the gate spacers GS and the top surface of the substrate 100 may be greater than a distance between the top surfaces of the first and second gate electrodes GE1 and GE2 and the top surface of the substrate 100. The top surfaces of the gate spacers GS may be coplanar with a top surface of a first interlayer insulating layer 110, which will be described below. For example, the top surfaces of the gate spacers GS may be substantially aligned with the top surface of the first interlayer insulating layer 110. The gate spacers GS may be formed of or include at least one of, for example, SiCN, SiCON, or SiN. In exemplary embodiments, the gate spacers GS may have a multi-layered structure including at least two of, for example, SiCN, SiCON, or SiN layers.

Gate capping patterns GP may be provided on the first and second gate electrodes GE1 and GE2, respectively. The gate capping patterns GP may extend along the first and second gate electrodes GE1 and GE2 and in the first direction D1. The gate capping patterns GP may be formed of or include at least one of materials which are selected to have an etch selectivity with respect to first and second interlayer insulating layers 110 and 120 to be described below. For example, the gate capping patterns GP may be formed of or include at least one of SiON, SiCN, SiCON, or SiN.

A first gate insulating pattern GI1 may be interposed between the first gate electrode GE1 and the first active pattern AP1 and between the first gate electrode GE1 and the second active pattern AP2. The first gate insulating pattern GI1 may be interposed between the first gate electrode GE1 and the gate spacers GS. A second gate insulating pattern GI2 may be interposed between the second gate electrode GE2 and the first active pattern AP1 and between the second gate electrode GE2 and the second active pattern AP2. The second gate insulating pattern GI2 may be interposed between the second gate electrode GE2 and the gate spacers GS.

The first and second gate insulating patterns GI1 and GI2 may extend in bottom surfaces of the first and second gate electrodes GE1 and GE2, respectively. Each of the first and second gate insulating patterns GI1 and GI2 may cover a top surface and opposite side surfaces of the first channel region CH1. Each of the first and second gate insulating patterns GI1 and GI2 may cover a top surface and opposite side surfaces of the second channel region CH2. The first and second gate insulating patterns GI1 and GI2 may cover a top surface of the device isolation layer ST, which is provided below the first and second gate electrodes GE1 and GE2 (e.g., see FIG. 2C).

The first gate insulating pattern GI1 may include a dielectric pattern DE and a ferroelectric pattern FE disposed on the dielectric pattern DE. A thickness of the ferroelectric pattern FE may be greater than or about equal to a thickness of the dielectric pattern DE.

According to an exemplary embodiment of the inventive concept, the dielectric pattern DE may serve as a positive capacitor. The dielectric pattern DE may include, for example, a silicon oxide layer, a high-k dielectric layer, or a multi-layered structure in which a silicon oxide layer and a high-k dielectric layer are sequentially stacked. As an example, the high-k dielectric layer may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In an exemplary embodiment, the ferroelectric pattern FE may serve as a negative capacitor. For example, when an external voltage is applied to the ferroelectric pattern FE, owing to movement of dipoles in the ferroelectric pattern FE, a phase of the ferroelectric pattern FE may be changed to a state different from its initial polarization state, and thus, a negative capacitance effect may occur. In this case, a total capacitance of the transistor including the ferroelectric pattern FE may be increased. As a result, in an exemplary embodiment, sub-threshold swing characteristics of the transistor may be improved, and an operation voltage may be reduced.

The ferroelectric pattern FE may include hafnium oxide including at least one of, for example, zirconium (Zr), silicon (Si), aluminum (Al), or lanthanum (La). The ferroelectric pattern FE may include hafnium oxide doped with at least one of, for example, zirconium (Zr), silicon (Si), aluminum (Al), or lanthanum (La). In the case in which hafnium oxide is doped in a specific ratio with at least one of zirconium (Zr), silicon (Si), aluminum (Al), or lanthanum (La), at least a portion of the ferroelectric pattern FE may have an orthorhombic crystal structure. When at least a portion of the ferroelectric pattern FE has an orthorhombic crystal structure, a negative capacitance effect may occur. A volume ratio of a volume of the portion which has the orthorhombic crystal structure to a total volume of the ferroelectric pattern FE may range from about 10% to about 50%.

The term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

In the case in which the ferroelectric pattern FE includes zirconium-doped hafnium oxide (ZrHfO), a ratio of the number of Zr atoms to the number of Zr and Hf atoms (e.g., Zr/(Hf+Zr)) may range from about 45 at % to about 55 at %. In the case in which the ferroelectric pattern FE includes silicon-doped hafnium oxide (SiHfO), a ratio of the number of Si atoms to the number of Si and Hf atoms (e.g., Si/(Hf+Si)) may range from about 4 at % to about 6 at %. In the case in which the ferroelectric pattern FE includes aluminum-doped hafnium oxide (AlHfO), a ratio of the number of Al atoms to the number of Al and Hf atoms (e.g., Al/(Hf+Al)) may range from about 5 at % to about 10 at %. In the case in which the ferroelectric pattern FE includes lanthanum-doped hafnium oxide (LaHfO), a ratio of the number of La atoms to the number of La and Hf atoms (e.g., La/(Hf+La)) may range from about 5 at % to about 10 at %.

In an exemplary embodiment, the first gate insulating pattern GI1 includes both the dielectric pattern DE and the ferroelectric pattern FE, and the second gate insulating pattern GI2 includes the dielectric pattern DE but does not include the ferroelectric pattern FE. For example, in an exemplary embodiment, the second gate insulating pattern GI2 is formed only of the dielectric pattern DE, and does not include the ferroelectric pattern FE (or any other ferroelectric material).

Each of the first and second gate electrodes GE1 and GE2 may include a first work function metal pattern WF1, a second work function metal pattern WF2, and an electrode pattern EL, which are sequentially stacked. The first work function metal pattern WF1 may be provided on the ferroelectric pattern FE. For example, the ferroelectric pattern FE may be interposed between the first work function metal pattern WF1 and the first and second channel regions CH1 and CH2.

The first work function metal pattern WF1 may include a metal nitride layer (e.g., a titanium nitride layer (TiN) or a tantalum nitride layer (TaN)). The second work function metal pattern WF2 may include a metal carbide layer, which includes aluminum or silicon or is doped with aluminum or silicon. As an example, the second work function metal pattern WF2 may include TiAlC, TaAlC, TiSiC or TaSiC. The electrode pattern EL may have resistance lower than the first work function metal pattern WF1 and the second work function metal pattern WF2. As an example, the electrode pattern EL may include at least one of low resistance metals including aluminum (Al), tungsten (W), titanium (Ti), and tantalum (Ta).

A thickness of the first work function metal pattern WF1 on the first and second PMOSFET regions PR1 and PR2 shown in FIG. 2A may be greater than a thickness of the first work function metal pattern WF1 on the first and second NMOSFET regions NR1 and NR2 shown in FIG. 2B. A thickness of the second work function metal pattern WF2 on the first and second NMOSFET regions NR1 and NR2 shown in FIG. 2B may be greater than a thickness of the first work function metal pattern WF1 on the first and second PMOSFET regions PR1 and PR2 shown in FIG. 2A.

The first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with top surfaces of the gate capping patterns GP and top surfaces of the gate spacers GS. For example, the top surface of the first interlayer insulating layer 110, the top surfaces of the gate capping patterns GP and the top surfaces of the gate spacers GS may be substantially aligned with one another. A second interlayer insulating layer 120 may be disposed on the first interlayer insulating layer 110 and may cover the gate capping patterns GP. As an example, the first and second interlayer insulating layers 110 and 120 may include silicon oxide.

Active contacts AC may be provided at both sides of and adjacent to each of the first and second gate electrodes GE1 and GE2. The active contacts AC may penetrate the first and second interlayer insulating layers 110 and 120 and may be electrically connected to the first and second source/drain patterns SD1 and SD2. The active contacts AC may include at least one of metallic materials (e.g., aluminum, copper, tungsten, molybdenum, and cobalt).

A metal silicide layer may be interposed between the first and second source/drain patterns SD1 and SD2 and the active contact AC. The active contact AC may be electrically connected to the first and second source/drain patterns SD1 and SD2 through the metal silicide layer. The metal silicide layer may include at least one of metal silicide materials including, for example, titanium silicide, tantalum silicide, tungsten silicide, nickel silicide, and cobalt silicide.

Gate contacts GC may penetrate the second interlayer insulating layer 120 and the gate capping pattern GP, and may be electrically connected to the first and second gate electrodes GE1 and GE2. The gate contacts GC may include the same metal material as the active contacts AC.

According to an exemplary embodiment of the inventive concept, the ferroelectric pattern FE may be provided between the gate electrode (e.g., GE1, GE2) and the channel region (e.g., CH1, CH2). The ferroelectric pattern FE may include an orthorhombic crystal structure, causing a negative capacitance effect. As a result, sub-threshold swing characteristics of the transistor may be improved and an operation voltage of the transistor may be reduced.

According to an exemplary embodiment of the inventive concept, the second gate insulating pattern GI2 may include only the dielectric pattern DE, and the first gate insulating pattern GI1 may include the dielectric pattern DE as well as the ferroelectric pattern FE. Thus, a threshold voltage of the transistor on the first PMOSFET region PR1 may be different from a threshold voltage of the transistor on the second PMOSFET region PR2. A threshold voltage of the transistor on the first NMOSFET region NR1 may be different from a threshold voltage of the transistor on the second NMOSFET region NR2. By differently providing layers constituting the gate insulating pattern from region to region, a difference in threshold voltage of the transistor from region to region may be realized.

Figure 8A:
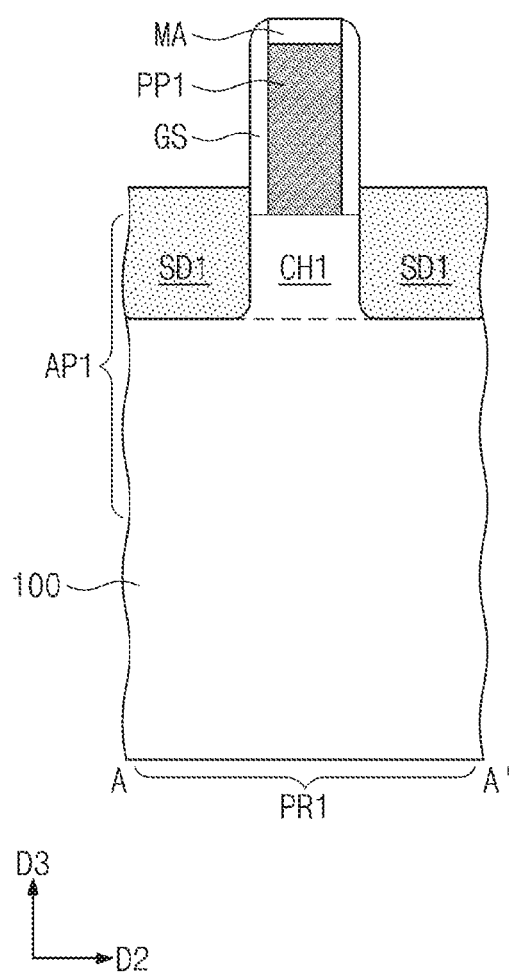
Figure 8B:
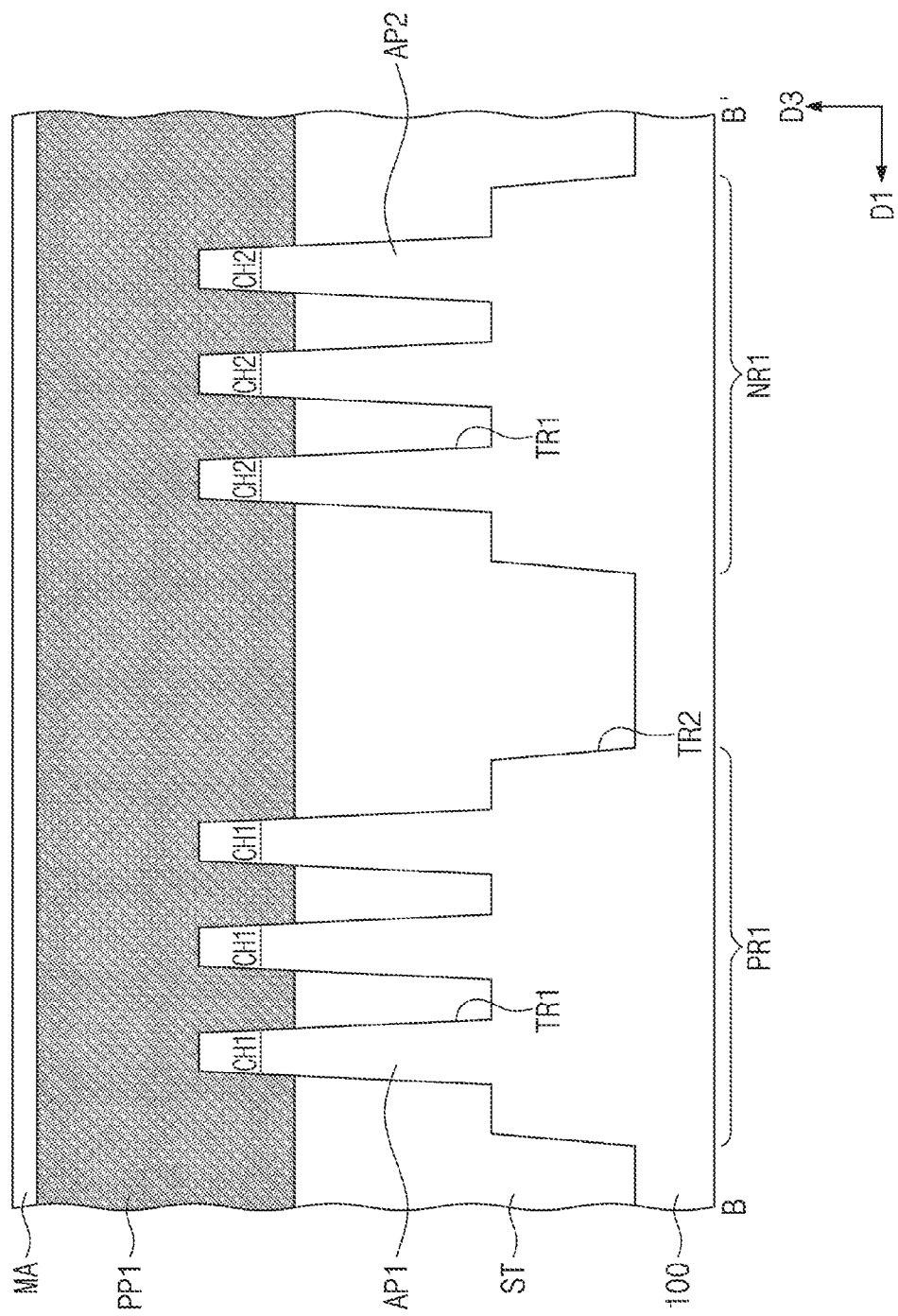
Figure 8C:
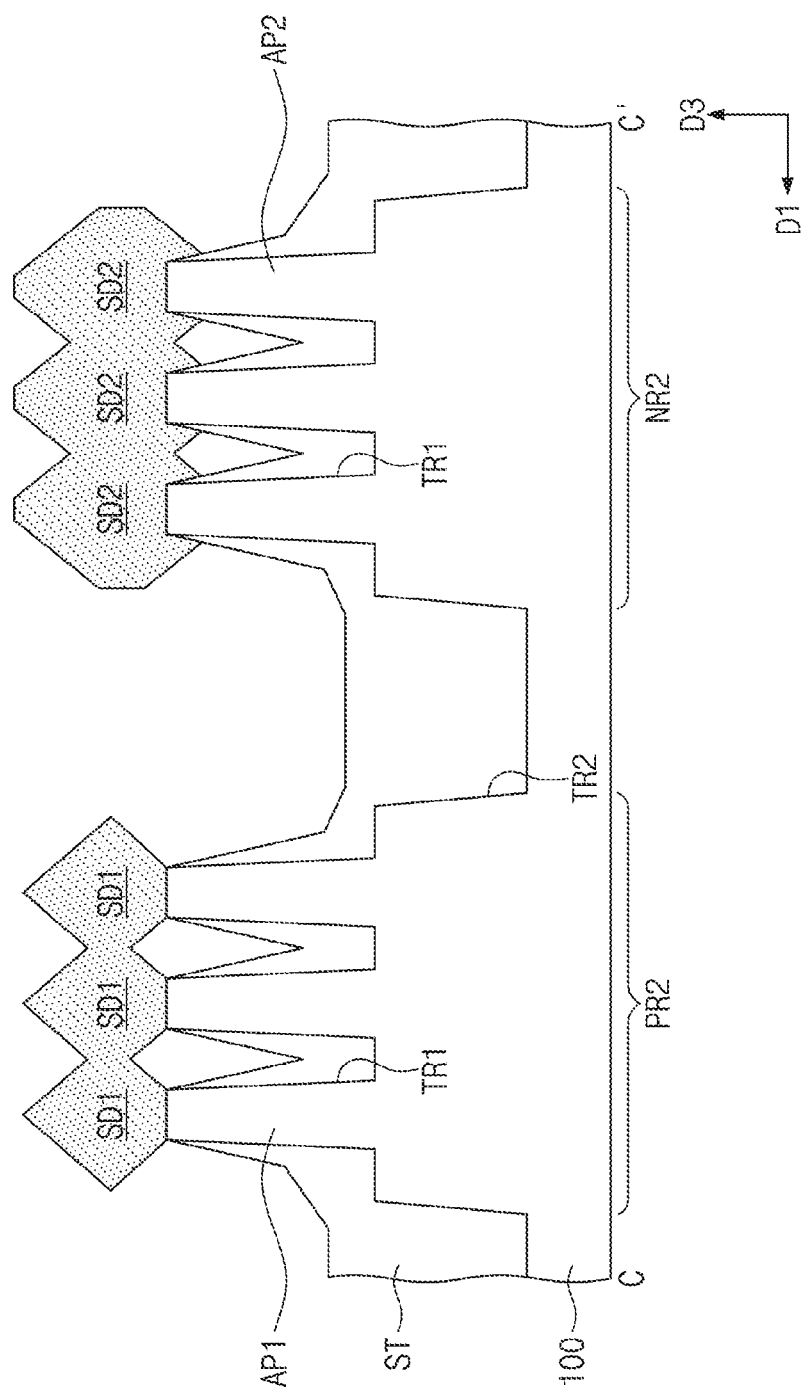
Figure 9:
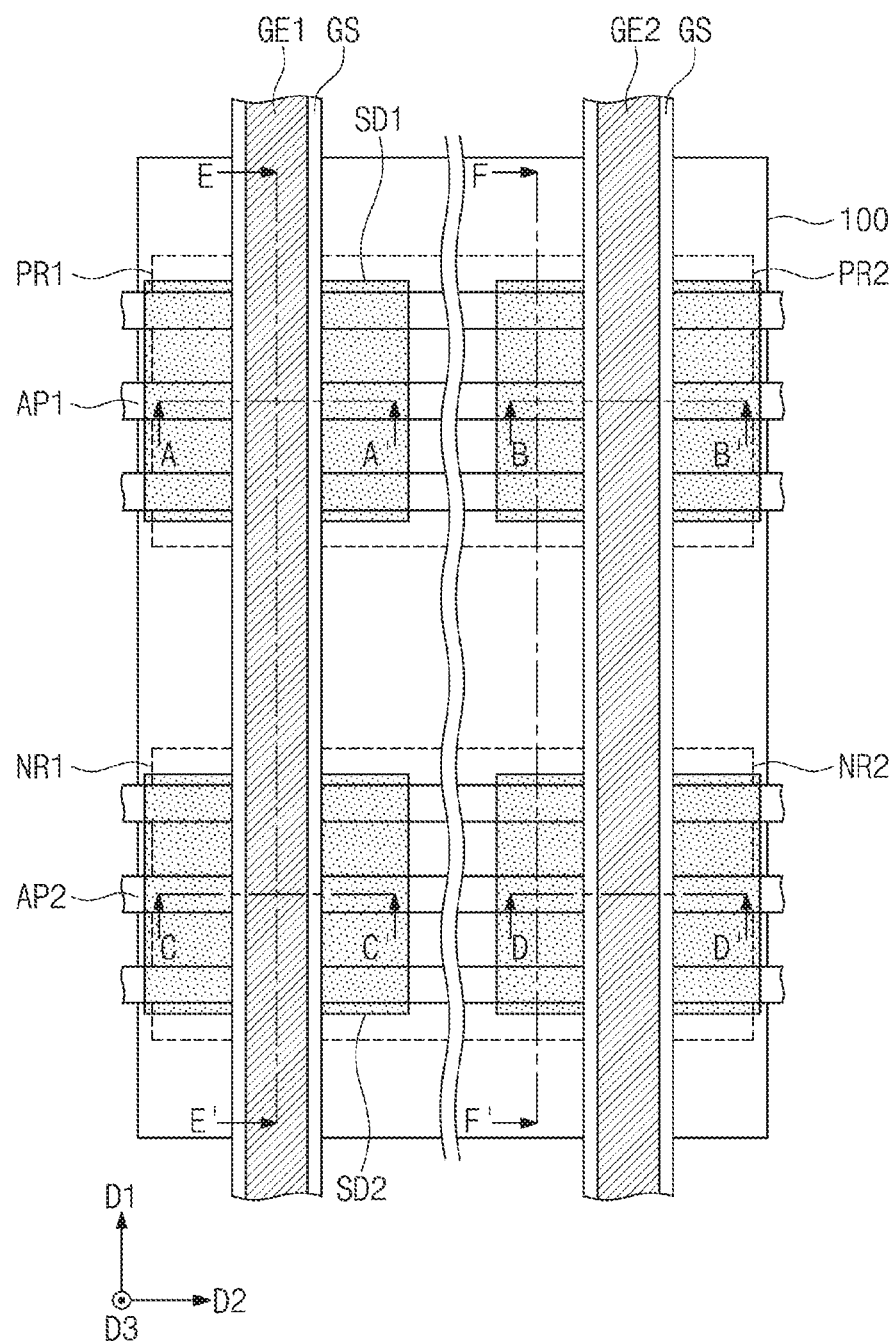
Figure 10A:
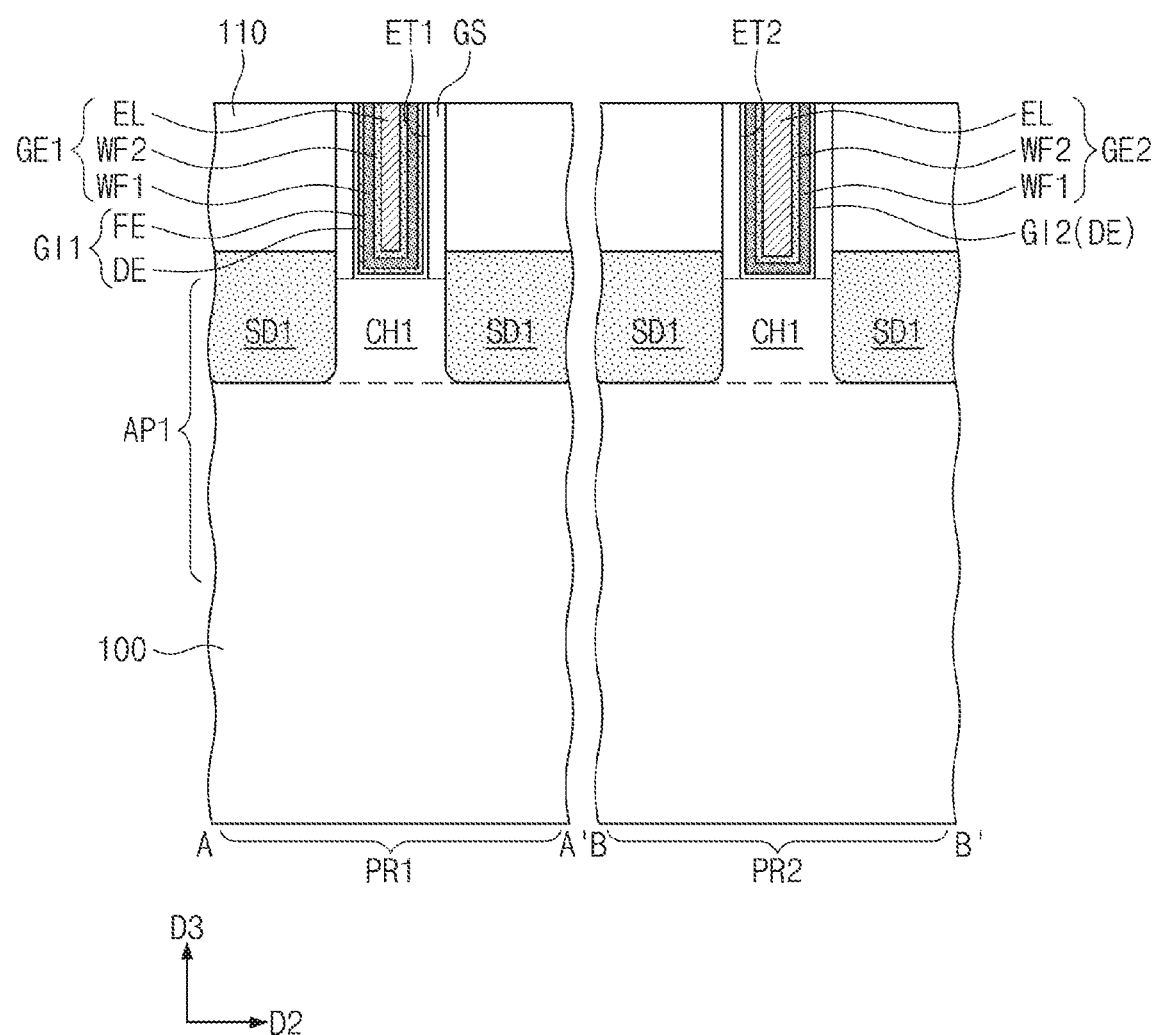
FIG. 10A is a cross-sectional view taken along lines A-A' and B-B' of FIG. 9.
Figure 10B:
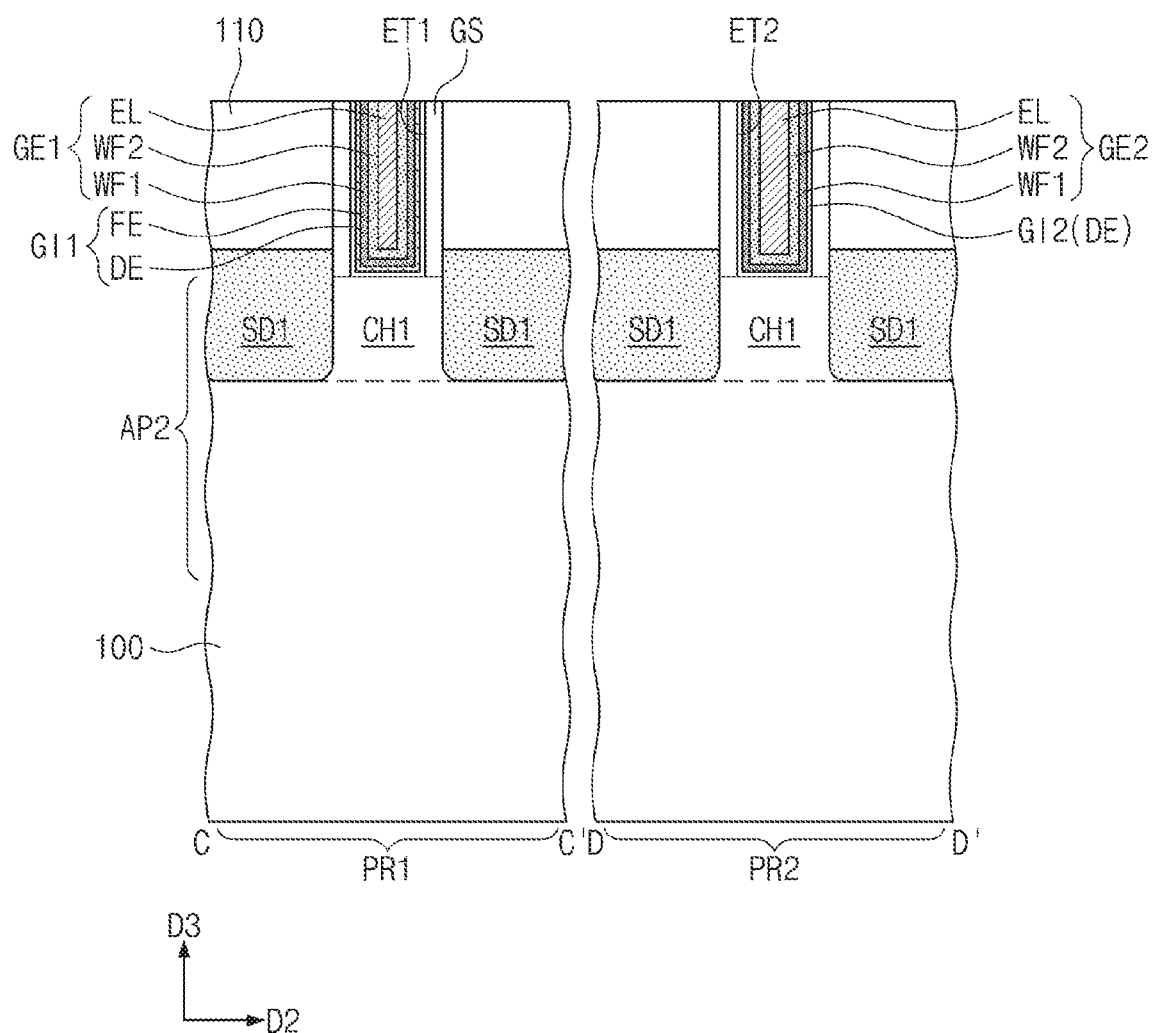
FIG. 10B is a cross-sectional view taken along lines C-C' and D-D' of FIG. 1.
Figure 10C:
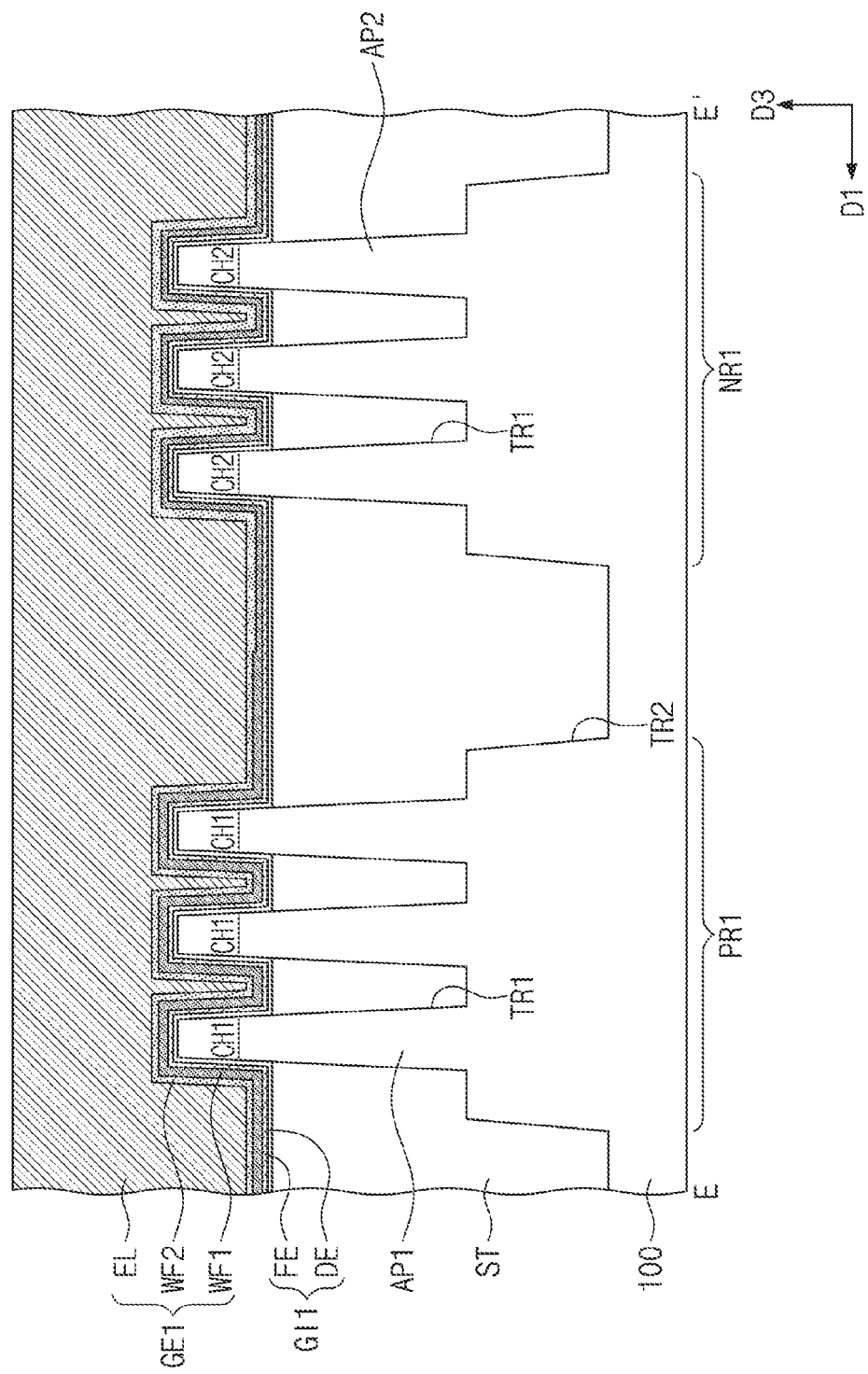
FIG. 10C is a cross-sectional view taken along line E-E' of FIG. 1.
Figure 10D:
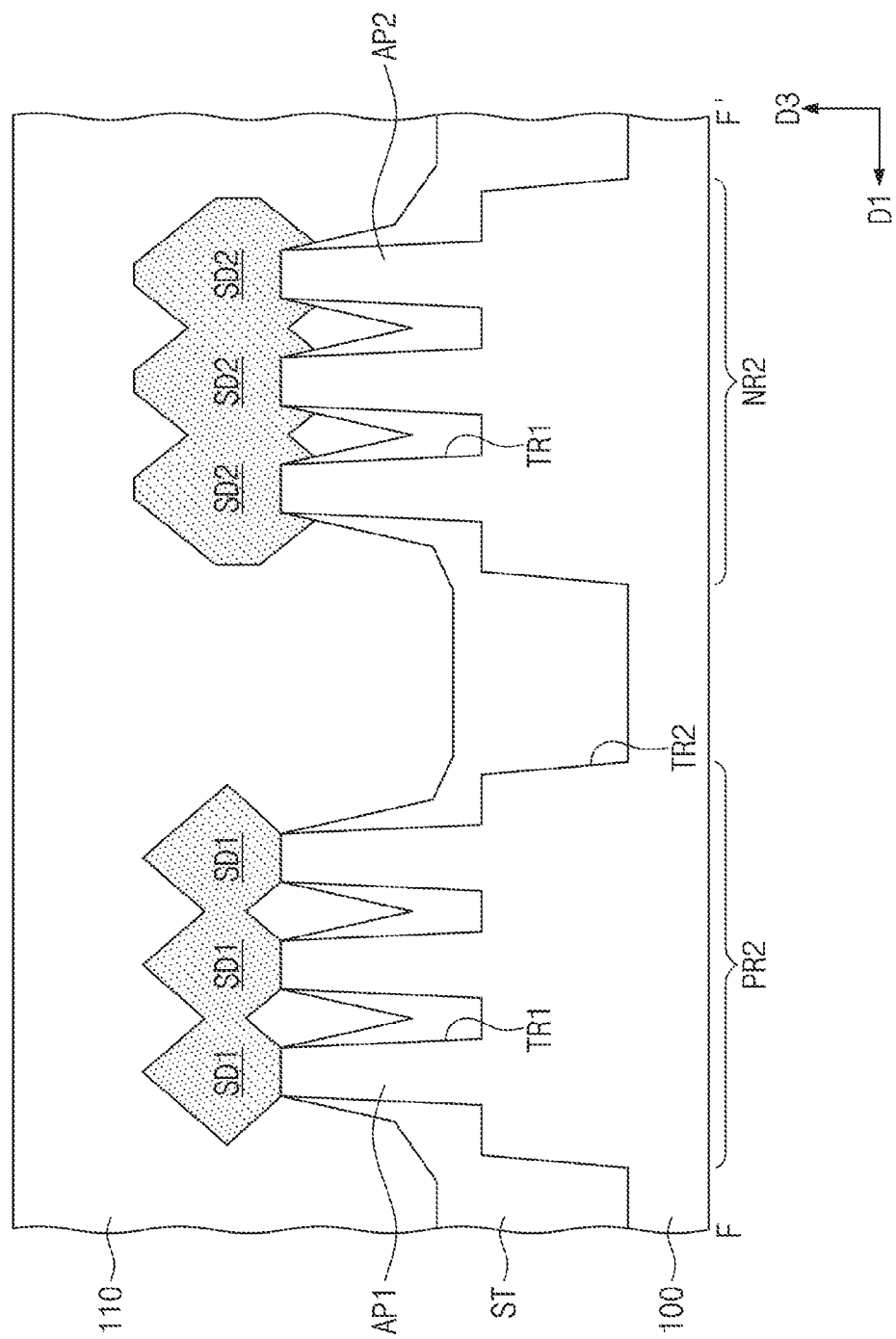
FIG. 10D is a cross-sectional view taken along line F-F' of FIG. 1.

FIGS. 3, 5, 7, and 9 are plan views illustrating a method of fabricating a semiconductor device according to an exemplary embodiment of the inventive concept. FIGS. 4, 6A, and 8A are cross-sectional views taken along line A-A' of FIGS. 3, 5, and 7, respectively. FIGS. 6B and 8B are cross-sectional views taken along line B-B' of FIGS. 5, 7, and 9, respectively. FIGS. 6C and 8C are cross-sectional views taken along line C-C' of FIGS. 5, 7, and 9, respectively. FIG. 10A is a cross-sectional view taken along lines A-A' and B-B' of FIG. 9. FIG. 10B is a cross-sectional view taken along lines C-C' and D-D' of FIG. 1. FIG. 10C is a cross-sectional view taken along line E-E' of FIG. 1. FIG. 10D is a cross-sectional view taken along line F-F' of FIG. 1.

Figure 3:
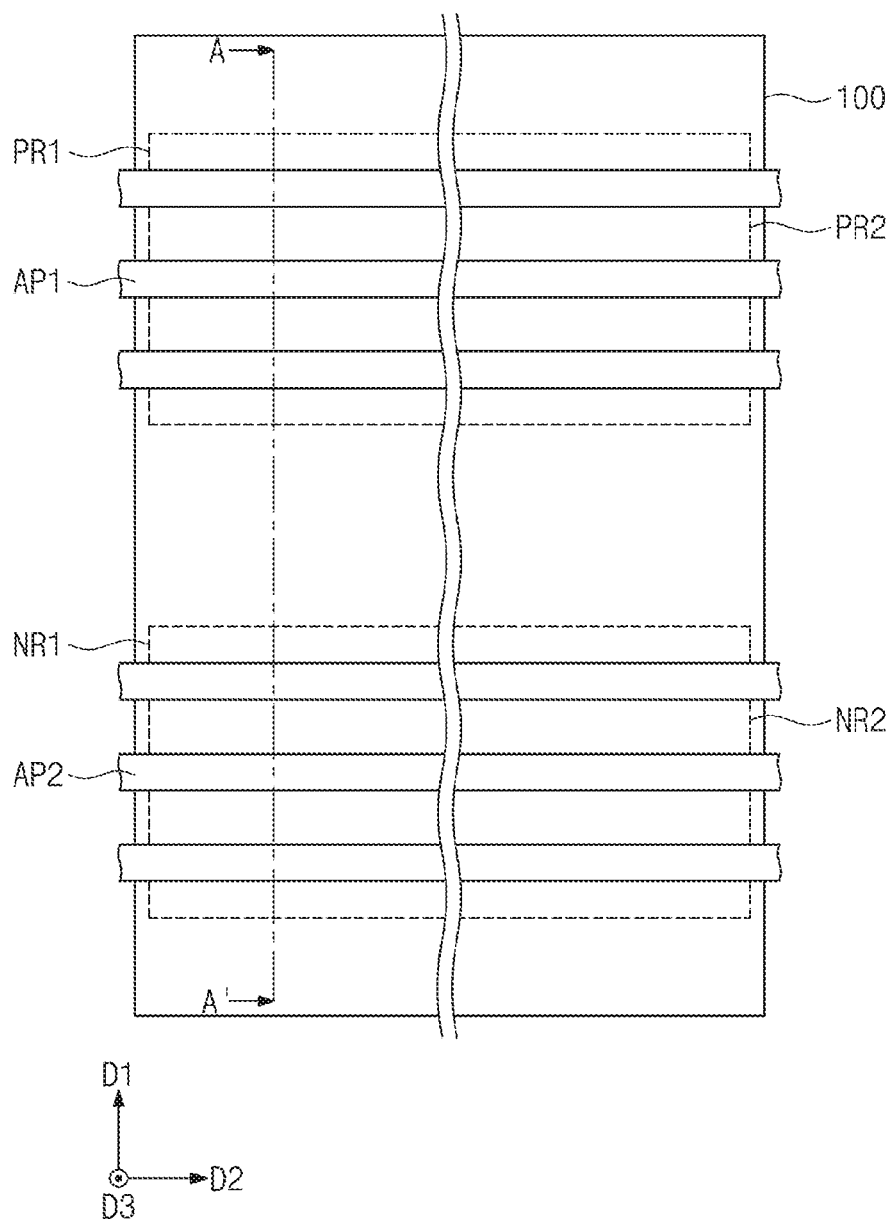
FIGS. 3, 5, 7, and 9 are plan views illustrating a method of fabricating a semiconductor device according to an exemplary embodiment of the inventive concept.
Figure 4:
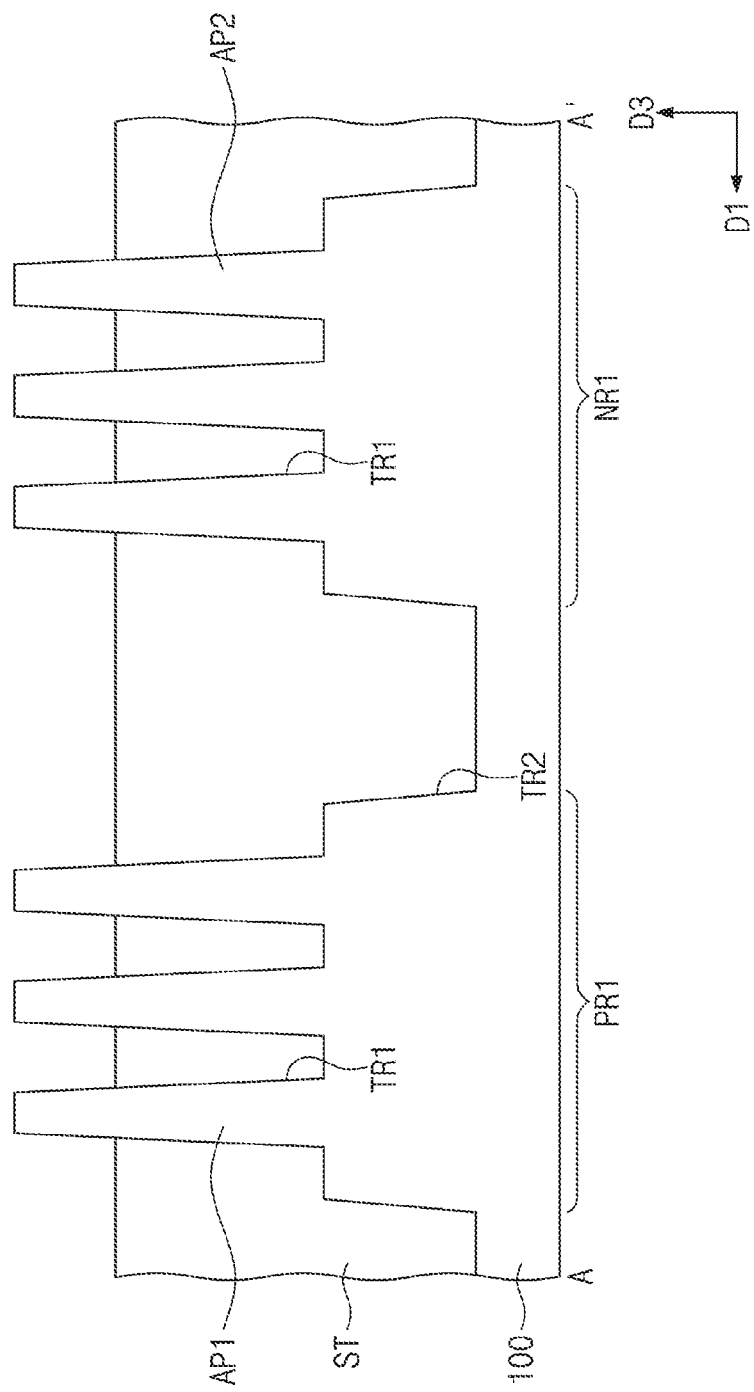
FIGS. 4, 6A, and 8A are cross-sectional views taken along line A-A' of FIGS. 3, 5, and 7, respectively.

Referring to FIGS. 3 and 4, the substrate 100 including the first PMOSFET region PR1, the second PMOSFET region PR2, the first NMOSFET region NR1, and the second NMOSFET region NR2 may be provided. The first and second active patterns AP1 and AP2 may be formed by patterning the substrate 100. The first active patterns AP1 may be formed on the first and second PMOSFET regions PR1 and PR2, and the second active patterns AP2 may be formed on the first and second NMOSFET regions NR1 and NR2. The first trench TR1 may be formed between the first active patterns AP1 and between the second active patterns AP2.

The substrate 100 may be patterned to form the second trench TR2 between the first PMOSFET region PR1 and the first NMOSFET region NR1 and between the second PMOSFET region PR2 and the second NMOSFET region NR2. The second trench TR2 may be formed to be deeper than the first trench TR1.

The device isolation layer ST may be formed on the substrate 100 to fill the first and second trenches TR1 and TR2. The device isolation layer ST may include an insulating material (e.g., a silicon oxide layer). The device isolation layer ST may be recessed to expose upper portions of the first and second active patterns AP1 and AP2. As a result, the upper portions of the first and second active patterns AP1 and AP2 may have a shape vertically protruding above the device isolation layer ST.

Figure 5:
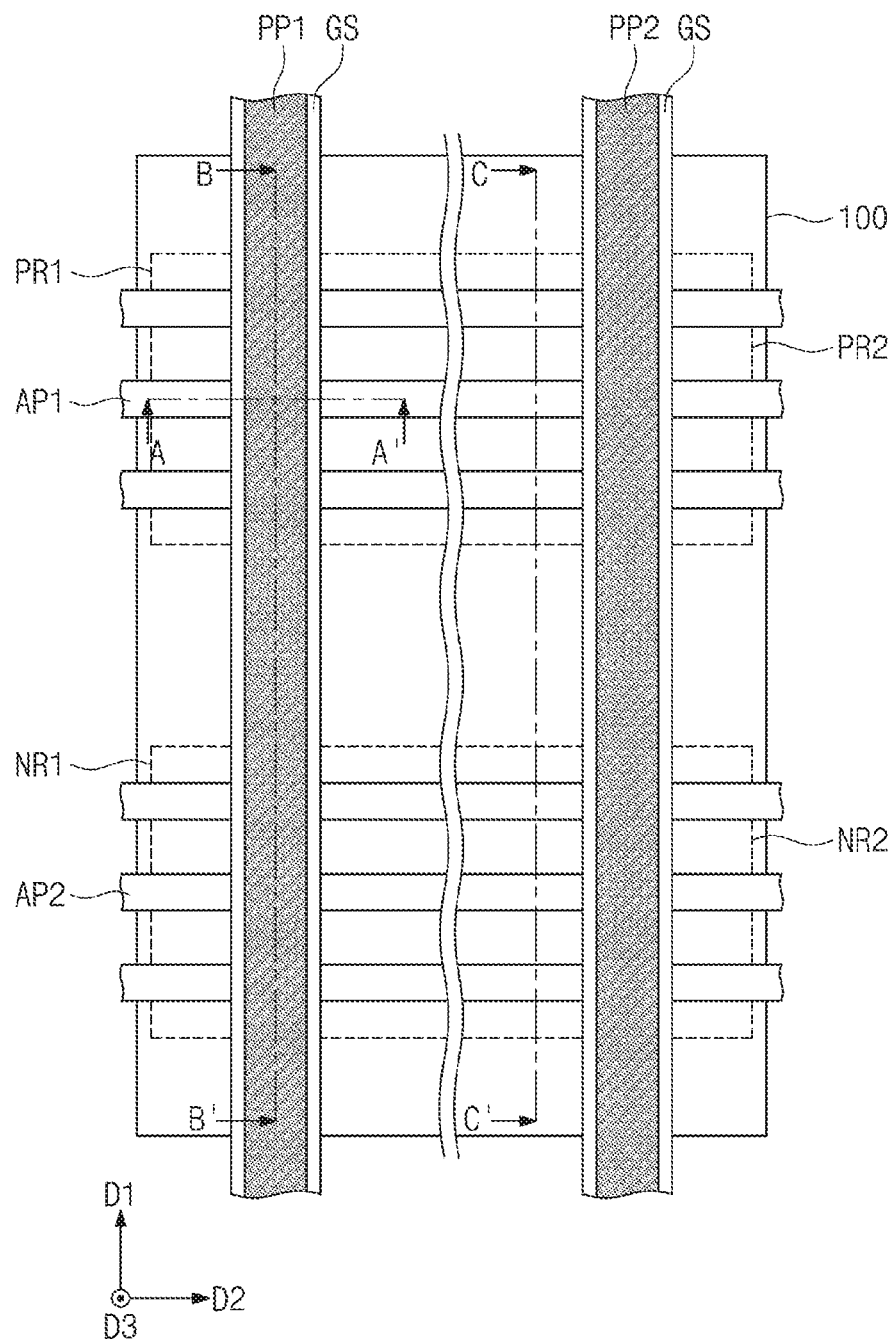
Figure 6A:
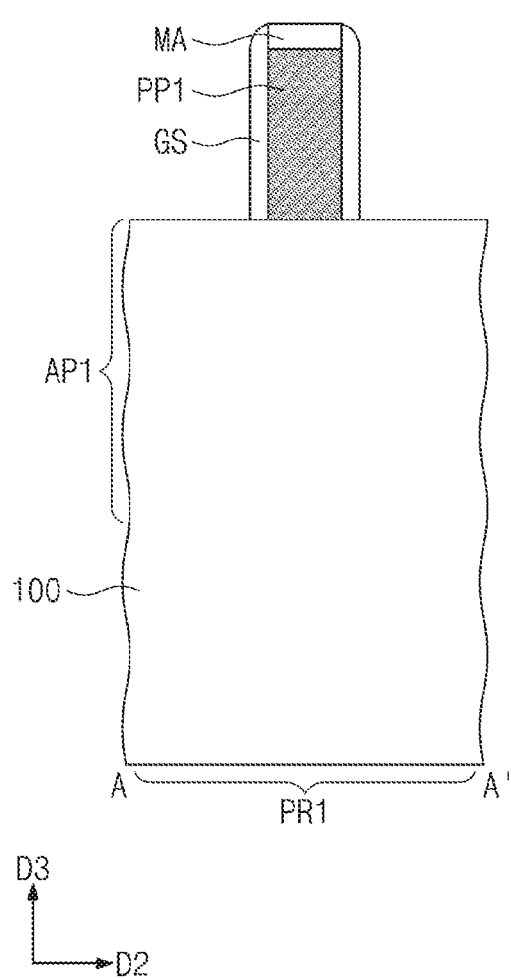
Figure 6C:
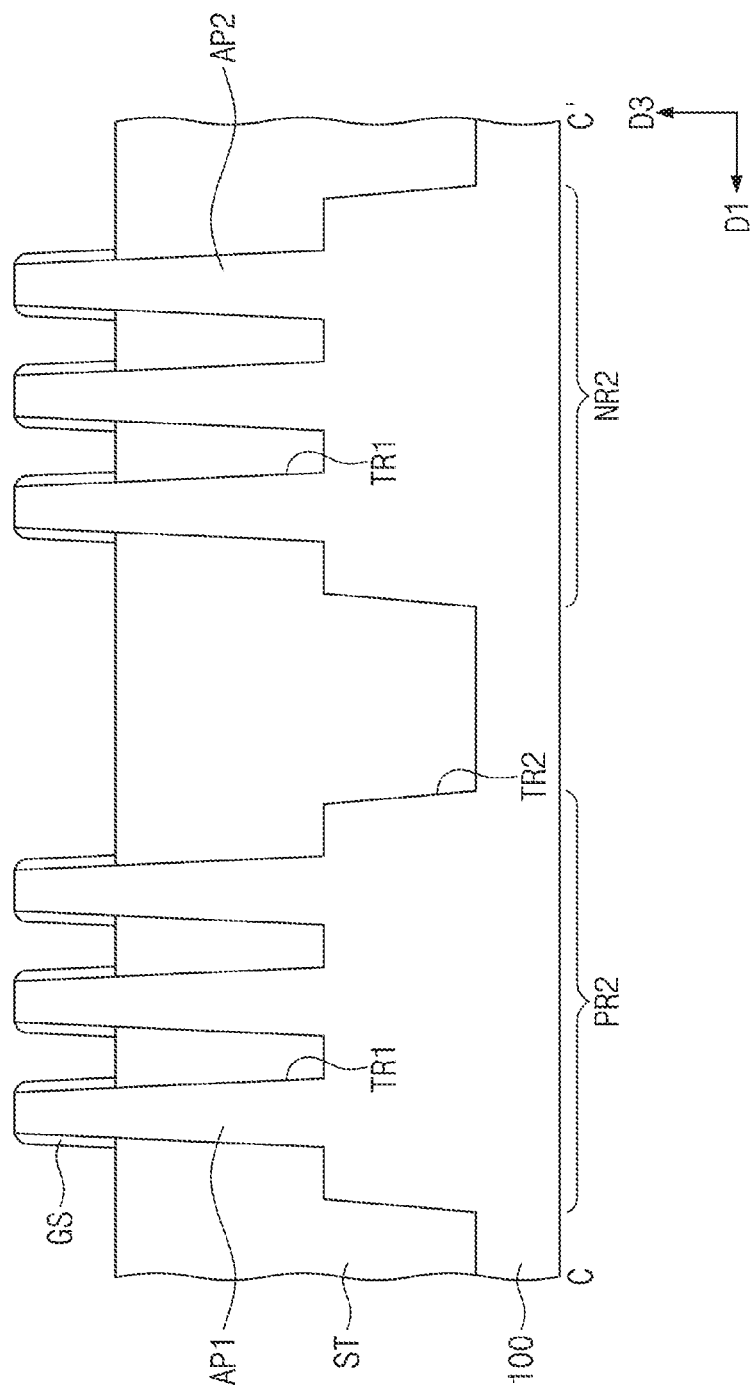
FIGS. 6C and 8C are cross-sectional views taken along line C-C' of FIGS. 5, 7, and 9, respectively.
Figure 7:
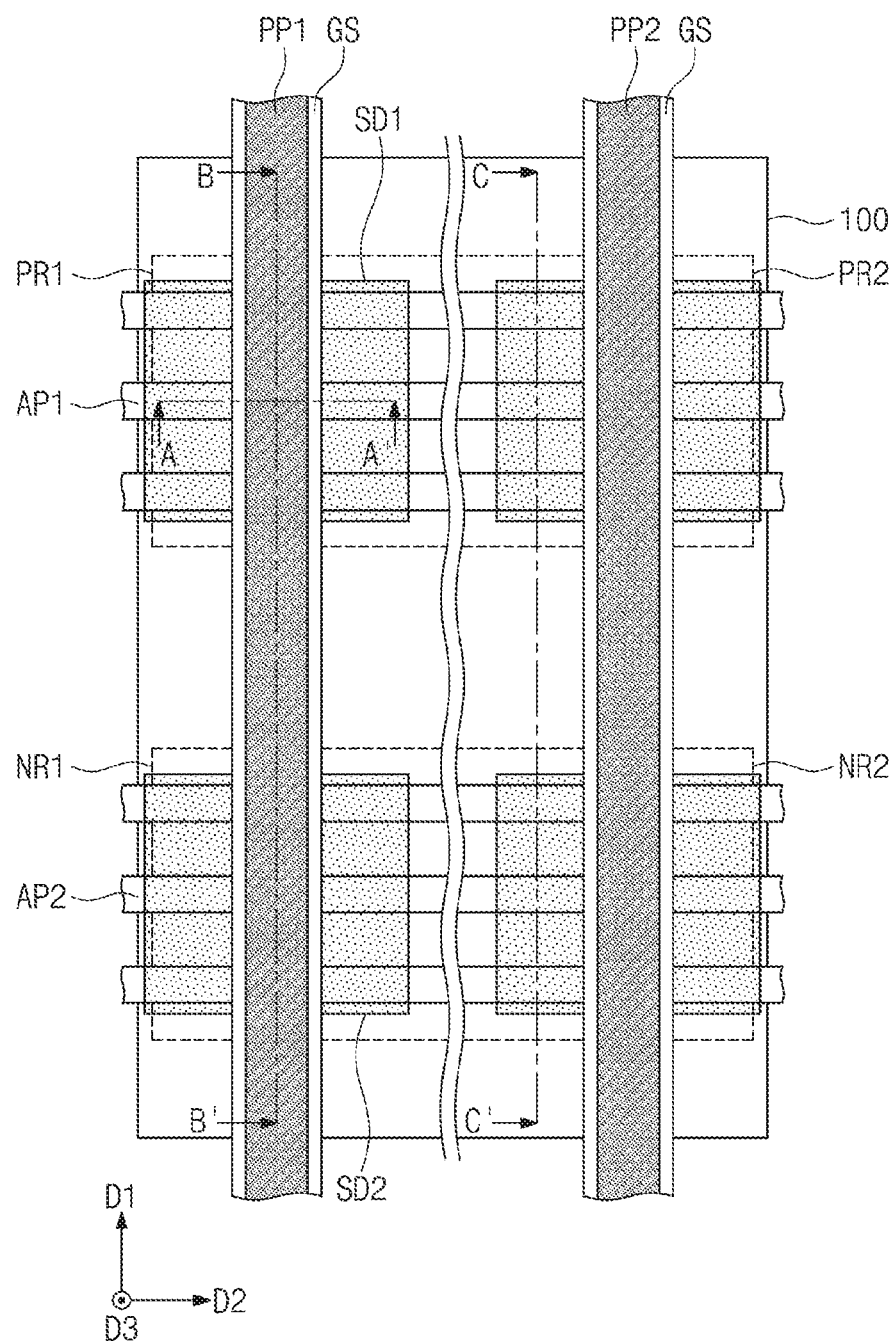

Referring to FIG. 5 and FIGS. 6A to 6C, a first sacrificial pattern PP1 and a second sacrificial pattern PP2 may be formed to cross the first and second active patterns AP1 and AP2. The first sacrificial pattern PP1 may cross the first PMOSFET region PR1 and the first NMOSFET region NR1, and the second sacrificial pattern PP2 may cross the second PMOSFET region PR2 and the second NMOSFET region NR2. The first and second sacrificial patterns PP1 and PP2 may be formed to have a line or bar shape extending in the first direction D1. For example, as shown in FIG. 5, the first and second sacrificial patterns PP1 and PP2 may have a substantially straight line shape extending in the first direction D1.

The formation of the first and second sacrificial patterns PP1 and PP2 may include forming a sacrificial layer on the substrate 100, forming hard mask patterns MA on the sacrificial layer, and patterning the sacrificial layer using the hard mask patterns MA as an etch mask. The sacrificial layer may include, for example, a poly-silicon layer.

A pair of the gate spacers GS may be respectively formed on opposite side surfaces of each of the first and second sacrificial patterns PP1 and PP2. The gate spacers GS may also be formed on opposite side surfaces of each of the first and second active patterns AP1 and AP2. The opposite side surfaces of each of the first and second active patterns AP1 and AP2 may be surfaces that are not covered with the device isolation layer ST and the sacrificial patterns PP1 and PP2. For example, the opposite side surfaces of each of the first and second active patterns AP1 and AP2 may be exposed.

The formation of the gate spacers GS may include conformally forming a gate spacer layer on the substrate 100 and anisotropically etching the gate spacer layer. The gate spacer layer may include at least one of, for example, SiCN, SiCON, or SiN. In an exemplary embodiment, the gate spacer layer may be a multi-layered structure including at least two of, for example, SiCN, SiCON, and SiN layers.

Referring to FIG. 7 and FIGS. 8A to 8C, the first source/drain patterns SD1 may be formed on or in the upper portions of each of the first active patterns AP1. A pair of the first source/drain patterns SD1 may be formed at both sides of each of the first and second sacrificial patterns PP1 and PP2.

For example, first recess regions may be formed by etching the upper portions of the first active patterns AP1 using the hard mask patterns MA and the gate spacers GS as an etch mask. The gate spacers GS on the opposite side surfaces of each of the first active patterns AP1 may be removed during the etching of the upper portions of the first active patterns AP1. The device isolation layer ST between the first active patterns AP1 may be recessed during the etching of the upper portions of the first active patterns AP1.

A selective epitaxial growth process, in which inner sidewalls of the first recess regions of the first active patterns AP1 are used as a seed layer, may be performed to form the first source/drain patterns SD1. As a result of the formation of the first source/drain patterns SD1, the first channel region CH1 may be defined between each pair of the first source/drain patterns SD1. As an example, the selective epitaxial growth process may include a chemical vapor deposition (CVD) process or a molecular beam epitaxy (MBE) process. The first source/drain patterns SD1 may include a semiconductor material (e.g., SiGe) having a lattice constant greater than that of the semiconductor substrate 100. Each of the first source/drain patterns SD1 may be formed of a plurality of semiconductor layers.

As an example, during the selective epitaxial growth process, the first source/drain patterns SD1 may be doped in-situ with impurities. As another example, after the formation of the first source/drain patterns SD1, impurities may be injected into the first source/drain patterns SD1. The first source/drain patterns SD1 may be doped to have a first conductivity type (e.g., p-type).

The second source/drain patterns SD2 may be formed on or in the upper portions of each of the second active patterns AP2. A pair of the second source/drain patterns SD2 may be formed at both sides of each of the sacrificial patterns PP1 and PP2.

For example, second recess regions may be formed by etching the upper portions of the second active patterns AP2 using the hard mask patterns MA and the gate spacers GS as an etch mask. A selective epitaxial growth process, in which inner sidewalls of the second recess regions of the second active patterns AP2 are used as a seed layer, may be performed to form the second source/drain patterns SD2. As a result of the formation of the second source/drain patterns SD2, the second channel region CH2 may be defined between each pair of the second source/drain patterns SD2. In an exemplary embodiment, the second source/drain patterns SD2 may include the same semiconductor material (e.g., Si) as that of the substrate 100. The second source/drain patterns SD2 may be doped to have a second conductivity type (e.g., n-type).

The first source/drain patterns SD1 and the second source/drain patterns SD2 may be sequentially formed through different processes. For example, the first source/drain patterns SD1 and the second source/drain patterns SD2 may not be formed at substantially the same time.

Referring to FIG. 9 and FIGS. 10A to 10D, the first interlayer insulating layer 110 may be formed to cover the first and second source/drain patterns SD1 and SD2, the hard mask patterns MA, and the gate spacers GS. As an example, the first interlayer insulating layer 110 may include a silicon oxide layer.

The first interlayer insulating layer 110 may be planarized to expose top surfaces of the first and second sacrificial patterns PP1 and PP2. The planarization of the first interlayer insulating layer 110 may be performed using, for example, an etch-back or chemical mechanical polishing (CMP) process. During the planarization process, all of the hard mask patterns MA may be removed. As a result, the first interlayer insulating layer 110 may have a top surface that is substantially coplanar with the top surfaces of the first and second sacrificial patterns PP1 and PP2 and the top surfaces of the gate spacers GS. For example, in an exemplary embodiment, the top surface of the first interlayer insulating layer 110, the top surfaces of the first and second sacrificial patterns PP1 and PP2, and the top surfaces of the gate spacers GS may be substantially aligned with one another.

The first and second sacrificial patterns PP1 and PP2 may be replaced with the first and second gate electrodes GE1 and GE2, respectively. For example, the first and second sacrificial patterns PP1 and PP2 exposed may be selectively removed, and a first empty space ET1 and a second empty space ET2 may be respectively formed as a result of removing the first and second sacrificial patterns PP1 and PP2.

The first gate insulating pattern GI1 and the first gate electrode GE1 may be formed in the first empty space ET1. The formation of the first gate insulating pattern GI1 may include sequentially forming the dielectric pattern DE and the ferroelectric pattern FE to partially fill the first empty space ET1. The dielectric pattern DE may include, for example, a silicon oxide layer, a high-k dielectric layer, or a multi-layered structure, in which a silicon oxide layer and a high-k dielectric layer are sequentially stacked. The ferroelectric pattern FE may be formed of or include, for example, hafnium oxide, which includes at least one of zirconium (Zr), silicon (Si), aluminum (Al), or lanthanum (La) or is doped with at least one of zirconium (Zr), silicon (Si), aluminum (Al), or lanthanum (La). The formation of the first gate electrode GE1 may include sequentially forming the first work function metal pattern WF1, the second work function metal pattern WF2, and the electrode pattern EL on the ferroelectric pattern FE.

The second gate insulating pattern GI2 and the second gate electrode GE2 may be formed in the second empty space ET2. The formation of the second gate insulating pattern GI2 may include forming the dielectric pattern DE to partially fill the second empty space ET2. The formation of the second gate electrode GE2 may include sequentially forming the first work function metal pattern WF1, the second work function metal pattern WF2, and the electrode pattern EL on the dielectric pattern DE.

After forming the first and second gate electrodes GE1 and GE2 in the first and second empty spaces ET1 and ET2, respectively, a planarization process may be performed to expose the top surface of the first interlayer insulating layer 110.

Referring back to FIG. 1 and FIGS. 2A to 2D, the second interlayer insulating layer 120 may be formed on the first interlayer insulating layer 110. The second interlayer insulating layer 120 may include, for example, a silicon oxide layer or a low-k oxide layer. As an example, the low-k oxide may include a carbon-doped silicon oxide layer, such as SiCOH. The second interlayer insulating layer 120 may be formed, for example, by a CVD process.

The active contacts AC may be formed to penetrate the second interlayer insulating layer 120 and the first interlayer insulating layer 110, and may be electrically connected to the first and second source/drain patterns SD1 and SD2. The gate contacts GC may penetrate the second interlayer insulating layer 120 and the gate capping pattern GP, and may be electrically connected to the first and second gate electrodes GE1 and GE2.

FIGS. 11 to 15 are cross-sectional views, each of which is taken along lines A-A' and B-B' of FIG. 1, and illustrates a semiconductor device according to an exemplary embodiment of the inventive concept. In the following description, elements previously described with reference to FIG. 1 and FIGS. 2A to 2D may be identified by the same reference numerals, and for convenience of explanation, a further description thereof may be omitted.

Figure 11:
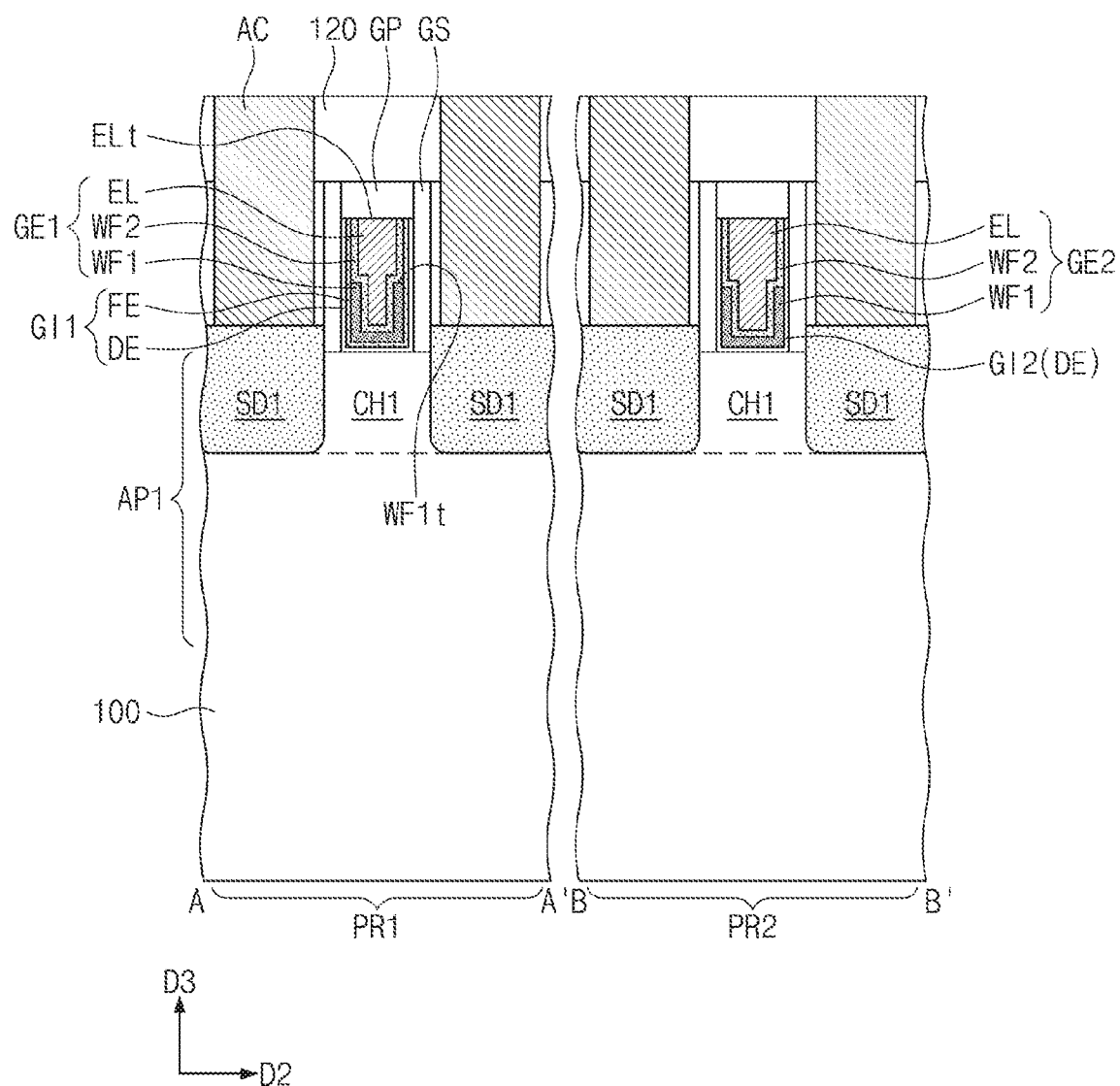
FIGS. 11 to 15 are cross-sectional views, each of which is taken along lines A-A' and B-B' of FIG. 1, and illustrates a semiconductor device according to an exemplary embodiment of the inventive concept.

Referring to FIGS. 1 and 11, an upper portion of the first work function metal pattern WF1 may be chamfered such that the first work function metal pattern WF1 has a top surface WF1t lower than a top surface ELt of the electrode pattern EL. For example, a distance between the top surface of the substrate 100 and the top surface WF1t of the first work function metal pattern WF1 may be less than a distance between the top surface of the substrate 100 and the top surface ELt of the electrode pattern EL. The second work function metal pattern WF2 may cover the top surface WF1t of the first work function metal pattern WF1. The chamfering of the upper portion of the first work function metal pattern WF1 may lead to an increase in width of an upper portion of the electrode pattern EL.

Figure 12:
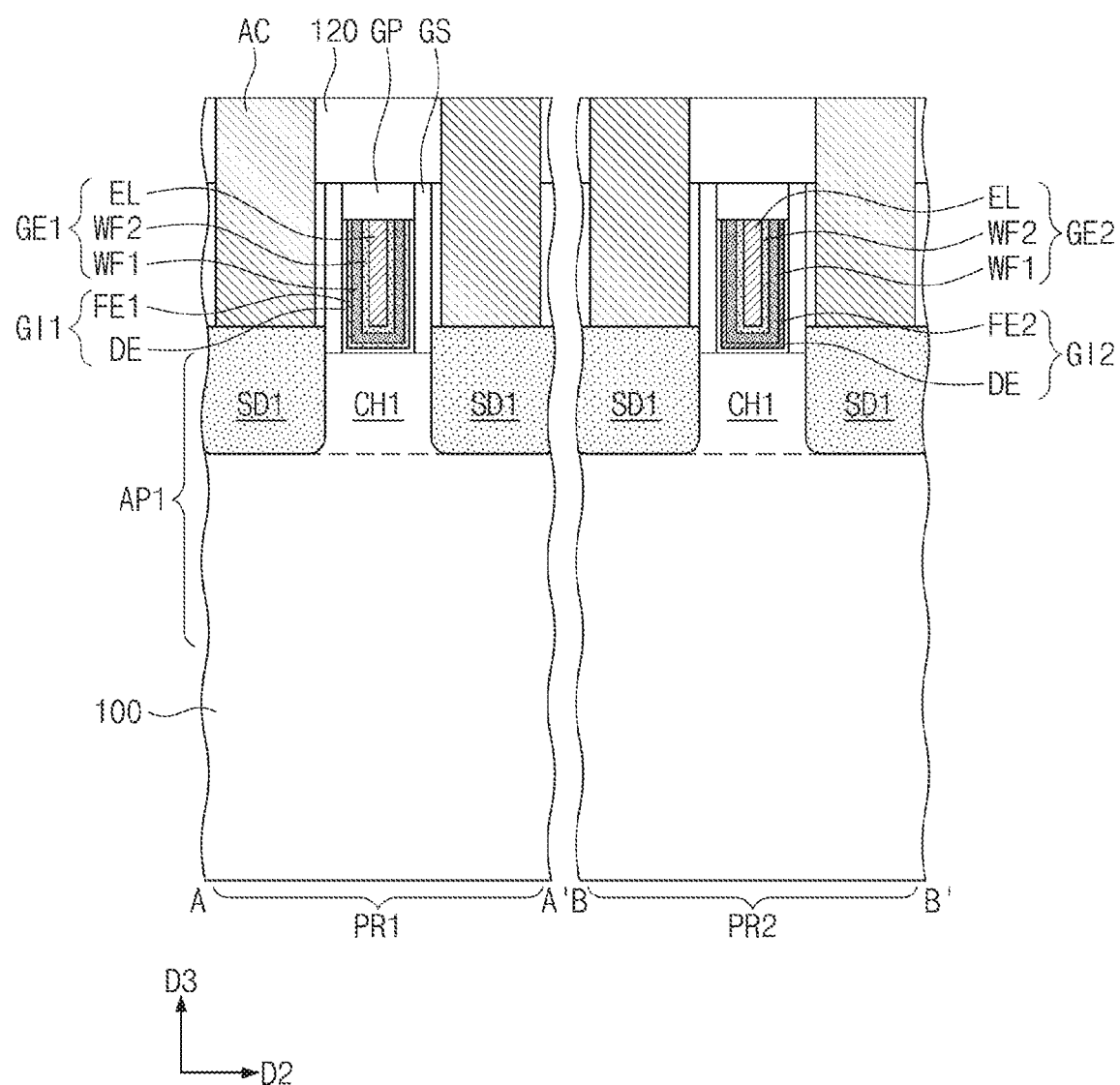

Referring to FIGS. 1 and 12, the first gate insulating pattern GI1 may include the dielectric pattern DE and a first ferroelectric pattern FE1, and the second gate insulating pattern GI2 may include the dielectric pattern DE and a second ferroelectric pattern FE2.

The first ferroelectric pattern FE1 and the second ferroelectric pattern FE2 may include different ferroelectric materials. As an example, the first ferroelectric pattern FE1 may include zirconium-doped hafnium oxide, and the second ferroelectric pattern FE2 may include aluminum-doped hafnium oxide.

In an exemplary embodiment, the first ferroelectric pattern FE1 and the second ferroelectric pattern FE2 may include the same ferroelectric material. However, an impurity concentration of the first ferroelectric pattern FE1 may be different from an impurity concentration of the second ferroelectric pattern FE2. As an example, the first ferroelectric pattern FE1 and the second ferroelectric pattern FE2 may include zirconium-doped hafnium oxide, and in this case, a ratio of Zr/(Hf+Zr) of the first ferroelectric pattern FE1 may be about 45 at %, and a ratio of Zr/(Hf+Zr) of the second ferroelectric pattern FE2 may be about 55 at %.

The first ferroelectric pattern FE1 and the second ferroelectric pattern FE2 may have substantially the same thickness. For example, the thickness of the first ferroelectric pattern FE1 and the second ferroelectric pattern FE2 may be equal to each other within a measurement error, or if measurably unequal, may be close enough in value to be functionally equal to each other as would be understood by a person having ordinary skill in the art. Alternatively, in an exemplary embodiment, the first ferroelectric pattern FE1 and the second ferroelectric pattern FE2 may have thicknesses different from each other.

Thus, in an exemplary embodiment, at least one of a ferroelectric material, an impurity concentration, and a thickness of the first ferroelectric pattern FE1 is different from at least one of a ferroelectric material, an impurity concentration, and a thickness of the second ferroelectric pattern FE2. That is, at least one of a ferroelectric material, an impurity concentration, and a thickness of the first and second ferroelectric patterns FE1 and FE2 is different between the first and second ferroelectric patterns FE1 and FE2 in an exemplary embodiment.

In an exemplary embodiment, the dielectric pattern DE included in the first gate insulating pattern GI1 may be referred to as a first dielectric pattern, and the dielectric pattern DE that forms the second gate insulating pattern GI2 may be referred to as a second dielectric pattern. In an exemplary embodiment, a side surface of the second dielectric pattern (e.g., DE) that forms the second gate insulating pattern GI2 is in direct contact with the gate spacer GS, and the opposite side surface of the second dielectric pattern (e.g., DE) that forms the second gate insulating pattern GI2 is in direct contact with the second gate electrode GE2.

Figure 13:
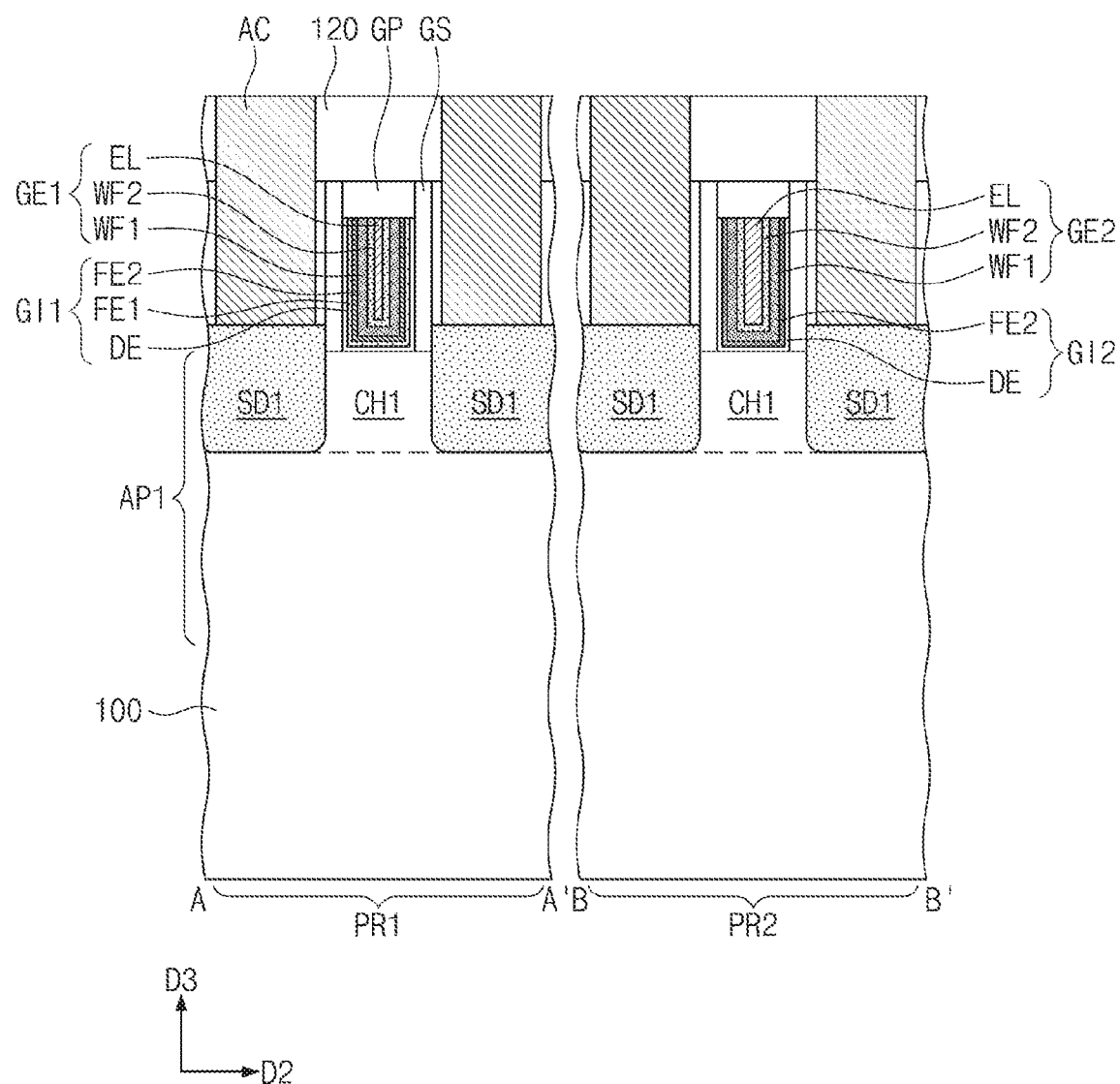

Referring to FIGS. 1 and 13, the first gate insulating pattern GI1 may include the dielectric pattern DE, the first ferroelectric pattern FE1, and the second ferroelectric pattern FE2, and the second gate insulating pattern GI2 may include the dielectric pattern DE and the second ferroelectric pattern FE2. Thus, as can be seen, in an exemplary embodiment, the first gate insulating pattern GI1 may include both the first ferroelectric pattern FE1 and the second ferroelectric pattern FE2 disposed on the first ferroelectric pattern FE1. In an exemplary embodiment, instead of including the second ferroelectric pattern FE2 disposed on the first ferroelectric pattern FE1, a third ferroelectric pattern different from the first and second ferroelectric patterns FE1 and FE2 may be disposed on the first ferroelectric pattern FE1 in the first gate insulating pattern GI1. The second ferroelectric pattern FE2 of the first gate insulating pattern GI1 may be interposed between the first work function metal pattern WF1 and the first ferroelectric pattern FE1. The first ferroelectric pattern FE1 and the second ferroelectric pattern FE2 may be substantially the same as those in the previous exemplary embodiment described with reference to FIG. 12.

Figure 14:
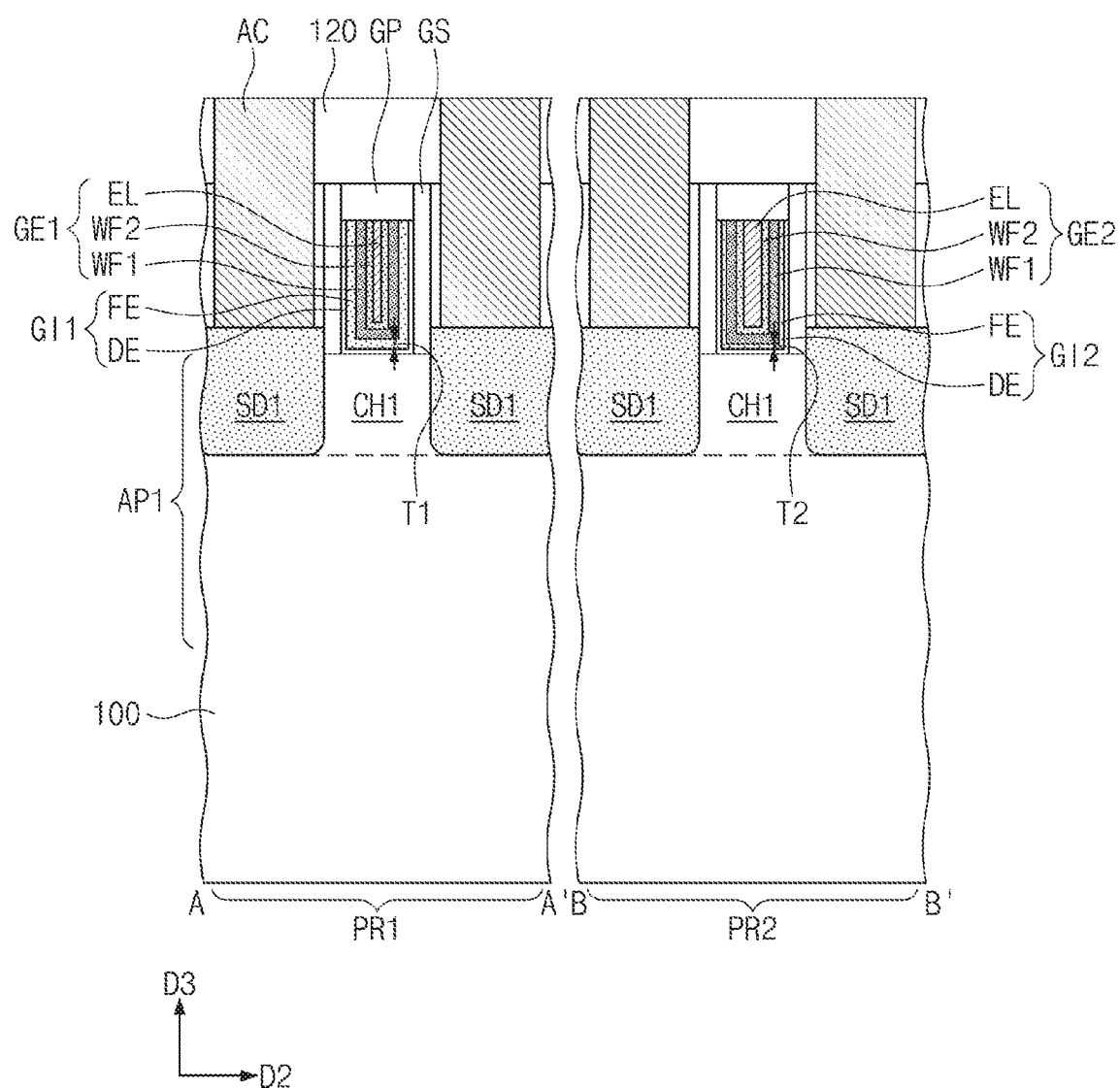

Referring to FIGS. 1 and 14, each of the first and second gate insulating patterns GI1 and GI2 may include the dielectric pattern DE and the ferroelectric pattern FE. The ferroelectric pattern FE of the first gate insulating pattern GI1 and the ferroelectric pattern FE of the second gate insulating pattern GI2 may include the same ferroelectric material. An impurity concentration of the ferroelectric pattern FE of the first gate insulating pattern GI1 may be about equal to an impurity concentration of the ferroelectric pattern FE of the second gate insulating pattern GI2.

The ferroelectric pattern FE of the first gate insulating pattern GI1 may have a first thickness T1, and the ferroelectric pattern FE of the second gate insulating pattern GI2 may have a second thickness T2. The first thickness T1 may be greater than the second thickness T2.

Figure 15:
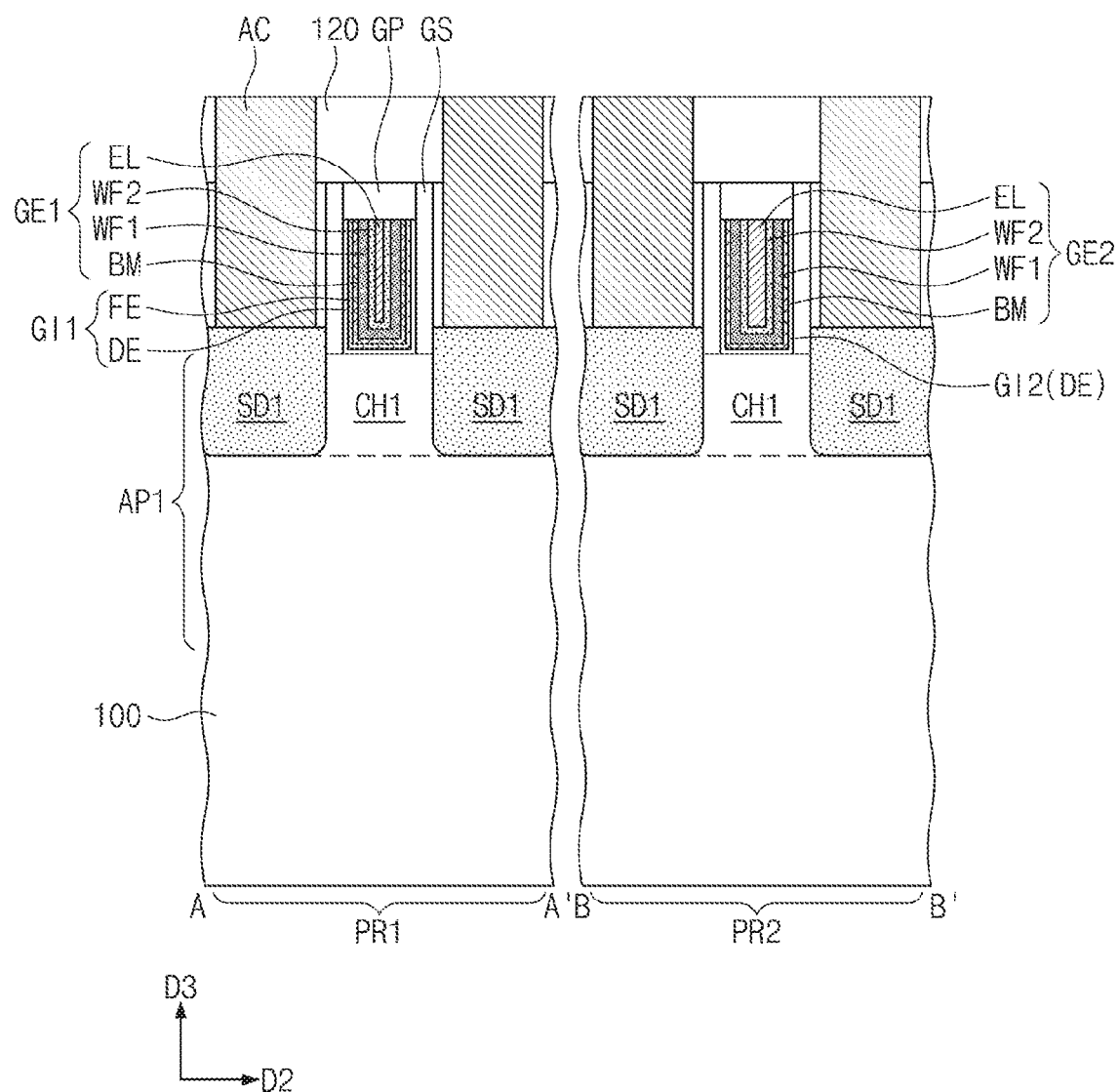

Referring to FIGS. 1 and 15, the first gate electrode GE1 may further include a barrier pattern BM interposed between the first gate insulating pattern GI1 and the first work function metal pattern WF1. The second gate electrode GE2 may further include the barrier pattern BM interposed between the second gate insulating pattern GI2 and the first work function metal pattern WF1. The barrier pattern BM may prevent a metallic element from being diffused between the first work function metal pattern WF1 and the gate insulating patterns GI1 and GI2. As an example, the barrier pattern BM may be formed of or include TiN, TaC, TaN, TiSiN, TaTiN, TaSiN, or any combination thereof, and may have a single- or multi-layered structure.

Figure 16:
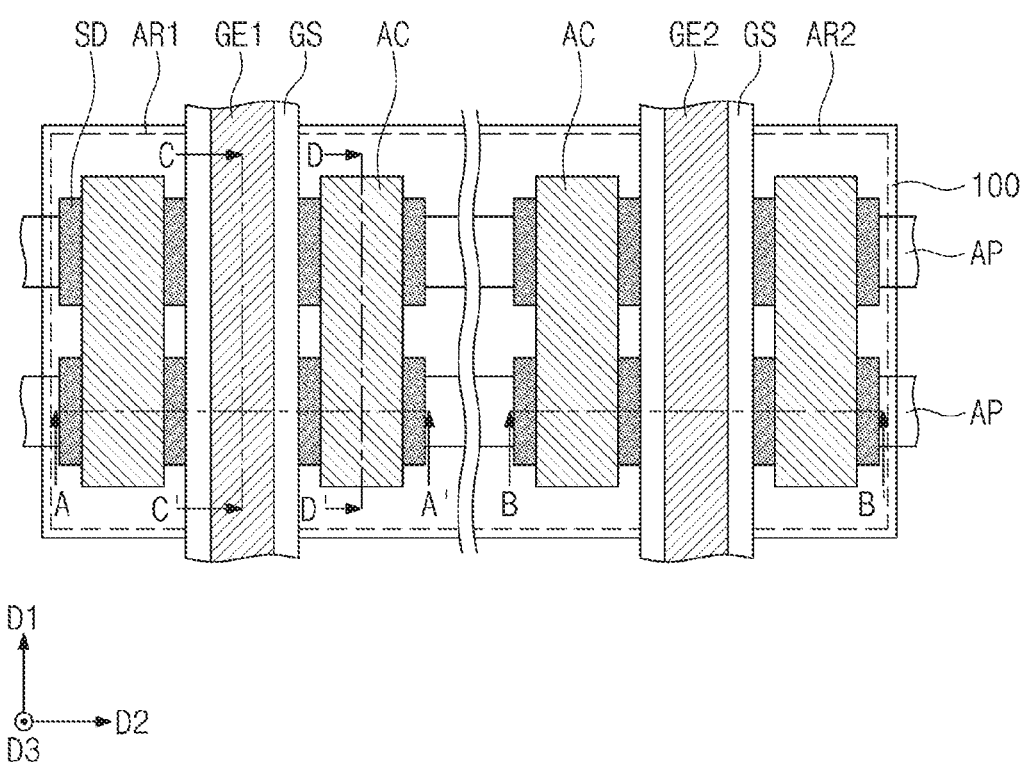
FIG. 16 is a plan view illustrating a semiconductor device according to an exemplary embodiment of the inventive concept.
Figure 17A:
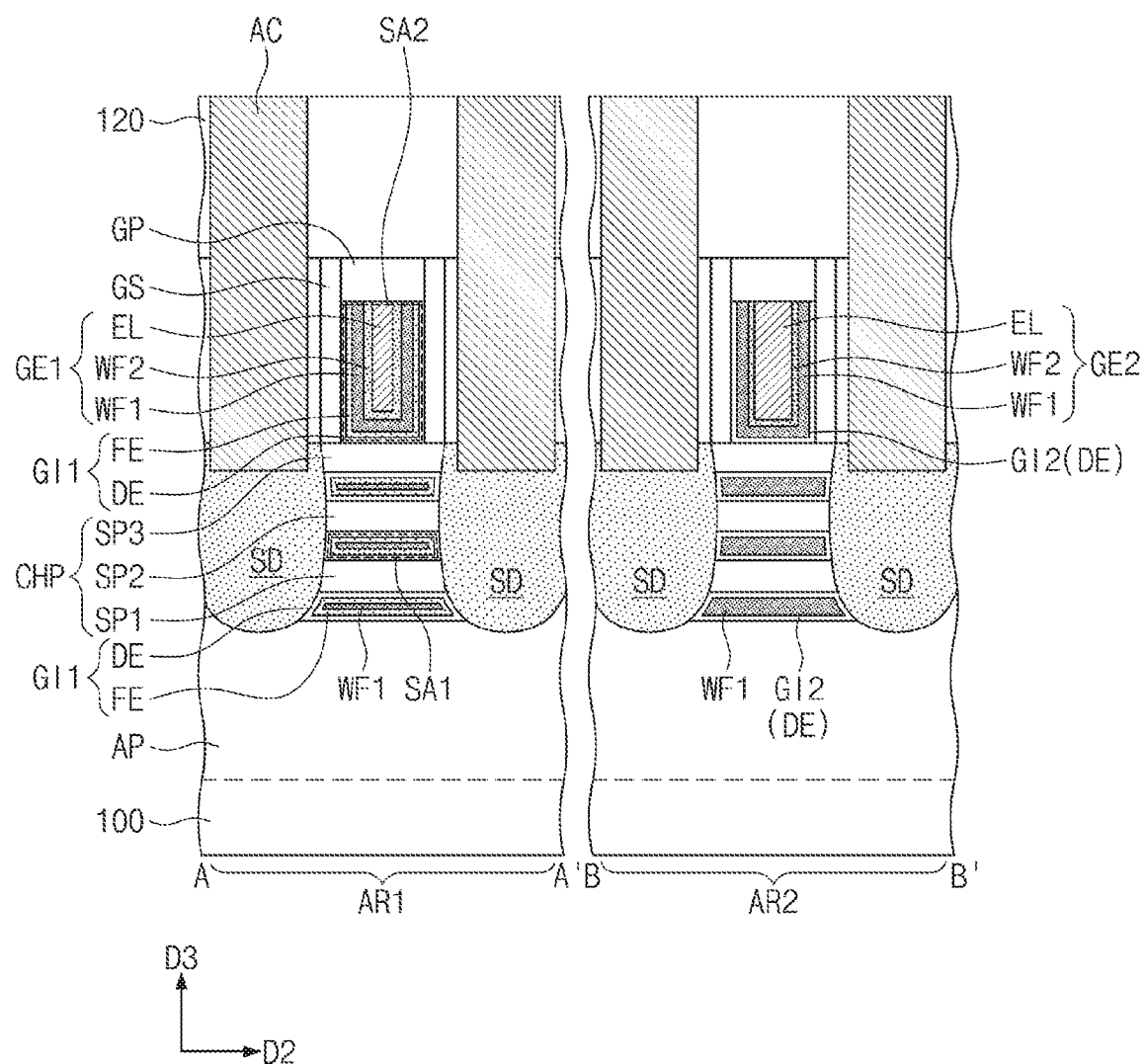
FIG. 17A is a cross-sectional view taken along lines A-A' and B-B' of FIG. 16.
Figure 17B:
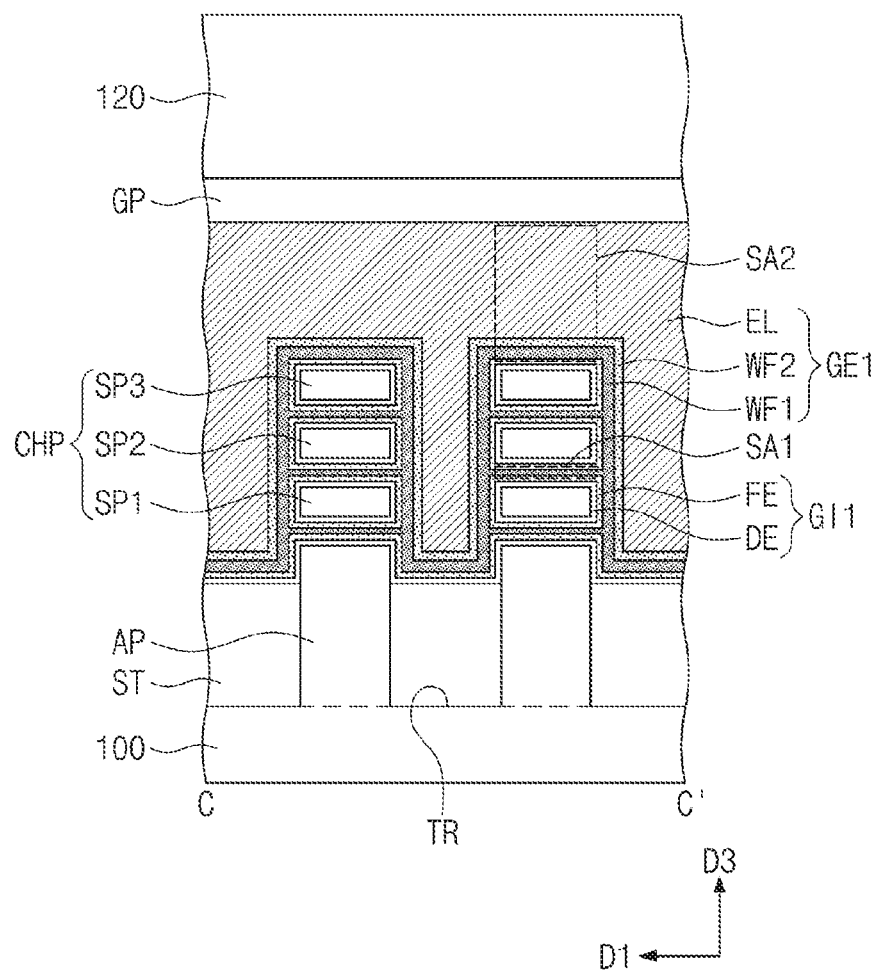
FIG. 17B is a cross-sectional view taken along line C-C' of FIG. 16.
Figure 17C:
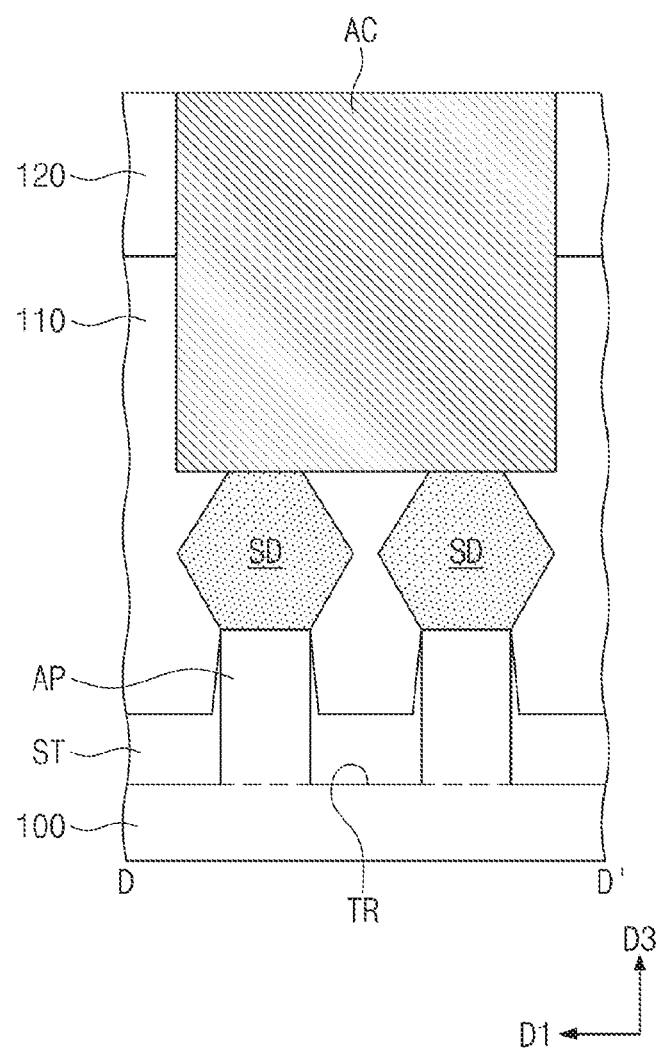
FIG. 17C is a cross-sectional view taken along line D-D' of FIG. 16.

FIG. 16 is a plan view illustrating a semiconductor device according to an exemplary embodiment of the inventive concept. FIG. 17A is a cross-sectional view taken along lines A-A' and B-B' of FIG. 16. FIG. 17B is a cross-sectional view taken along line C-C' of FIG. 16. FIG. 17C is a cross-sectional view taken along line D-D' of FIG. 16. In the following description, elements previously described with reference to FIG. 1 and FIGS. 2A to 2D may be identified by the same reference numerals, and for convenience of explanation, a further description of elements previously described may be omitted.

Referring to FIG. 16 and FIGS. 17A to 17C, the substrate 100 including a first active region AR1 and a second active region AR2 may be provided. Active patterns AP may be provided on the first and second active regions AR1 and AR2. As an example, the first and second active regions AR1 and AR2 may be a logic cell region. Logic transistors constituting a logic circuit may be disposed in the logic cell region.

The device isolation layer ST may be provided on the substrate 100. The device isolation layer ST may define the active patterns AP in an upper portion of the substrate 100. The active patterns AP may have a line or bar shape extending in the second direction D2. For example, as shown in FIG. 16, the active patterns AP may have a substantially straight line shape extending in the second direction D2.

The device isolation layer ST may fill a trench TR, which is formed between an adjacent pair of the active patterns AP. A top surface of the device isolation layer ST may be lower than top surfaces of the active patterns AP. For example, a distance between the top surface of the device isolation layer ST and the top surface of the substrate 100 may be less than a distance between the top surfaces of the active patterns AP and the top surface of the substrate 100.

Source/drain patterns SD and a channel pattern CHP, which is interposed between an adjacent pair of the source/drain patterns SD, may be provided on the active pattern AP. The channel pattern CHP may include first to third semiconductor patterns SP1, SP2, and SP3, which are sequentially stacked. The first to third semiconductor patterns SP1, SP2, and SP3 may be spaced apart from each other in a third direction D3 perpendicular to the top surface of the substrate 100. The first to third semiconductor patterns SP1, SP2, and SP3 may be vertically overlapped with each other. Each of the source/drain patterns SD may be in direct contact with a side surface of each of the first to third semiconductor patterns SP1, SP2, and SP3. Thus, the first to third semiconductor patterns SP1, SP2, and SP3 may connect an adjacent pair of the source/drain patterns SD to each other.

The first to third semiconductor patterns SP1, SP2, and SP3 of the channel pattern CHP may have the same thickness or different thicknesses. As an example, when measured in the second direction D2, the largest lengths of the first to third semiconductor patterns SP1, SP2, and SP3 of the channel pattern CHP may be different from each other. As an example, the largest length of the first semiconductor pattern SP1 in the second direction D2 may be a first length, the largest length of the second semiconductor pattern SP2 in the second direction D2 may be a second length, and the first length may be greater than the second length.

The first to third semiconductor patterns SP1, SP2, and SP3 of the channel pattern CHP may include at least one of, for example, silicon (Si), germanium (Ge), or silicon-germanium (SiGe). Although the channel pattern CHP is illustrated as having the first to third semiconductor patterns SP1, SP2, and SP3, the inventive concept is not limited to a specific number of the semiconductor patterns.

Each of the source/drain patterns SD may be an epitaxial pattern, which is formed by using the first to third semiconductor patterns SP1, SP2, and SP3 of the channel pattern CHP and the active pattern AP as a seed layer. As an example, a width of the source/drain pattern SD in the second direction D2 may be largest at its middle portion (e.g., see FIG. 17A). The width of the source/drain pattern SD in the second direction D2 may increase from its top portion toward the middle portion, and the width of the source/drain pattern SD in the second direction D2 may decrease from the middle portion toward its bottom portion. The source/drain patterns SD may be p-type impurity regions or n-type impurity regions. As an example, the source/drain patterns SD may be formed of or include SiGe or Si.

The first gate electrode GE1 may be provided to cross the channel pattern CHP in the first active region AR1 and to extend in the first direction D1, and the second gate electrode GE2 may be provided to cross the channel pattern CHP in the second active region AR2 and to extend in the first direction D1. The first and second gate electrodes GE1 and GE2 may be spaced apart from each other in the second direction D2. Each of the first and second gate electrodes GE1 and GE2 may be vertically overlapped with the channel pattern CHP. A pair of the gate spacers GS may be disposed on opposite side surfaces of each of the first and second gate electrodes GE1 and GE2. The gate capping patterns GP may be provided on the first and second gate electrodes GE1 and GE2, respectively.

Each of the first and second gate electrodes GE1 and GE2 may include the first work function metal pattern WF1, the second work function metal pattern WF2, and the electrode pattern EL, which are sequentially stacked. The first work function metal pattern WF1 may enclose each of the first to third semiconductor patterns SP1, SP2, and SP3 (e.g., see FIG. 17B). For example, the first work function metal pattern WF1 may be provided to face top, bottom, and opposite side surfaces of each of the first to third semiconductor patterns SP1, SP2, and SP3. For example, the transistors according to an exemplary embodiment may be field effect transistors of a gate-all-around type.

The first gate insulating pattern GI1 may be provided between the first to third semiconductor patterns SP1, SP2, and SP3 and the first gate electrode GE1. The second gate insulating pattern GI2 may be provided between the first to third semiconductor patterns SP1, SP2, and SP3 and the second gate electrode GE2. The first gate insulating pattern GI1 may include the dielectric pattern DE and the ferroelectric pattern FE, and the second gate insulating pattern GI2 may include the dielectric pattern DE. In an exemplary embodiment, the second gate insulating pattern GI2 does not include the ferroelectric pattern FE.

Each of the first and second gate insulating patterns GI1 and GI2 may enclose the first to third semiconductor patterns SP1, SP2, and SP3. Each of the first and second gate insulating patterns GI1 and GI2 may be interposed between the upper portion of the active pattern AP and the first work function metal pattern WF1. Each of the first and second gate insulating patterns GI1 and GI2 may be interposed between the device isolation layer ST and the first work function metal pattern WF1.

The dielectric pattern DE, the ferroelectric pattern FE, the first work function metal pattern WF1, the second work function metal pattern WF2, and the electrode pattern EL may be substantially the same as those in the previous exemplary embodiment described with reference to FIG. 1 and FIGS. 2A to 2D.

A first space SA1 may be defined between the first semiconductor pattern SP1 and the second semiconductor pattern SP2 in the first active region AR1. For example, the first space SA1 may be defined between each pair of the semiconductor patterns SP1, SP2, and SP3, which are vertically adjacent to each other.

The dielectric pattern DE, the ferroelectric pattern FE, and the first work function metal pattern WF1 may fill the first space SA1. The dielectric pattern DE and the ferroelectric pattern FE may be provided to conformally fill the first space SA1. The first work function metal pattern WF1 may fill a remaining region of the first space SA1, which is not filled with the first gate insulating pattern GI1. In an exemplary embodiment, the second work function metal pattern WF2 and the electrode pattern EL do not fill the first space SA1. The first gate insulating pattern GI1 in the first space SA1 may be in contact with the source/drain pattern SD (e.g., see FIG. 17A). For example, the first gate insulating pattern GI1 in the first space SA1 may be interposed between the first gate electrode GE1 and the source/drain pattern SD.

A second space SA2 may be defined on the uppermost one (e.g., the third semiconductor pattern SP3) of the semiconductor patterns in the first active region AR1. The second space SA2 may be a space which is enclosed by a pair of the gate spacers GS, the gate capping pattern GP, and the third semiconductor pattern SP3.

The dielectric pattern DE, the ferroelectric pattern FE, the first work function metal pattern WF1, the second work function metal pattern WF2, and the electrode pattern EL may fill the second space SA2. The structure or shapes of the dielectric pattern DE, the ferroelectric pattern FE, the first work function metal pattern WF1, the second work function metal pattern WF2, and the electrode pattern EL filling the second space SA2 may be similar to that of the previous exemplary embodiment described with reference to FIG. 1 and FIGS. 2A to 2D.

The first interlayer insulating layer 110 and the second interlayer insulating layer 120 may be provided on the substrate 100. The active contacts AC may be provided to penetrate the first and second interlayer insulating layers 110 and 120, and may be electrically connected to the source/drain patterns SD.

According to an exemplary embodiment of the inventive concept, a semiconductor device includes a transistor with improved sub-threshold swing characteristics and a reduced operation voltage. The semiconductor device includes a gate insulating pattern with a ferroelectric pattern. As a result, transistors whose threshold voltages are different from each other from region to region may be realized according to exemplary embodiments of the inventive concept.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
   a substrate comprising a first active region and a second active region;
   a first active pattern and a second active pattern disposed in the first and second active regions, respectively;
   a device isolation layer, which fills a trench defining the first and second active patterns,
   a first gate electrode and a second gate electrode crossing the first and second active patterns, respectively; and
   a first gate insulating pattern interposed between the first active pattern and the first gate electrode, and a second gate insulating pattern interposed between the second active pattern and the second gate electrode, wherein the first gate insulating pattern comprises a first dielectric pattern and a first ferroelectric pattern disposed on the first dielectric pattern, the second gate insulating pattern comprises a second dielectric pattern, a threshold voltage of a transistor in the first active region is different from a threshold voltage of a transistor in the second active region, an upper portion of each of the first and second active patterns protrudes above the device isolation layer, and the first ferroelectric pattern is disposed on a top surface and opposite side surfaces of the upper portion of the first active pattern.

2. The semiconductor device of claim 1, wherein the first ferroelectric pattern comprises hafnium oxide comprising at least one of zirconium (Zr), silicon (Si), aluminum (Al), or lanthanum (La).

3. The semiconductor device of claim 2, wherein the first ferroelectric pattern comprises a portion having an orthorhombic crystal structure, and a volume ratio of the portion having the orthorhombic crystal structure to the first ferroelectric pattern ranges from about 10% to about 50%.

4. The semiconductor device of claim 1, wherein each of the first and second dielectric patterns comprises a silicon oxide layer, a high-k dielectric layer, or a multi-layered structure in which the silicon oxide layer and the high-k dielectric layer are sequentially stacked.

5. The semiconductor device of claim 1, wherein each of the first and second gate electrodes comprises a first work function metal pattern, a second work function metal pattern, and an electrode pattern, which are sequentially stacked, the first work function metal pattern comprises a metal nitride layer, and the second work function metal pattern comprises a metal carbide layer comprising aluminum or silicon.

6. The semiconductor device of claim 5, wherein a top surface of the first work function metal pattern is lower than a top surface of the electrode pattern, and the second work function metal pattern covers the top surface of the first work function metal pattern.

7. The semiconductor device of claim 1, wherein the second gate insulating pattern does not comprise the first ferroelectric pattern.

8. The semiconductor device of claim 1, wherein the second gate insulating pattern further comprises a second ferroelectric pattern disposed on the second dielectric pattern, and a ferroelectric material of the first ferroelectric pattern is different from a ferroelectric material of the second ferroelectric pattern.

9. The semiconductor device of claim 1, wherein the second gate insulating pattern further comprises a second ferroelectric pattern disposed on the second dielectric pattern, and a thickness of the first ferroelectric pattern is different from a thickness of the second ferroelectric pattern.

10. A semiconductor device, comprising:

a substrate comprising a first active region and a second active region;

a first active pattern and a second active pattern disposed in the first and second active regions, respectively;

a first gate electrode and a second gate electrode crossing the first and second active patterns, respectively; and a first gate insulating pattern interposed between the first active pattern and the first gate electrode, and a second gate insulating pattern interposed between the second active pattern and the second gate electrode, wherein the first gate insulating pattern comprises a first dielectric pattern and a first ferroelectric pattern disposed on the first dielectric pattern, the second gate insulating pattern comprises a second dielectric pattern and a second ferroelectric pattern disposed on the second dielectric pattern, and at least one of a ferroelectric material and an impurity concentration of the first ferroelectric pattern is different from at least one of a ferroelectric material and an impurity concentration of the second ferroelectric pattern.

11. The semiconductor device of claim 10, wherein a threshold voltage of a transistor in the first active region is different from a threshold voltage of a transistor in the second active region.

12. The semiconductor device of claim 10, wherein each of the first and second ferroelectric patterns comprises hafnium oxide doped with at least one of zirconium (Zr), silicon (Si), aluminum (Al), and lanthanum (La).

13. The semiconductor device of claim 10, wherein the first gate insulating pattern further comprises a third ferroelectric pattern disposed on the first ferroelectric pattern.

14. The semiconductor device of claim 10, further comprising:

a device isolation layer, which fills a trench defining the first and second active patterns, wherein an upper portion of each of the first and second active patterns protrudes above the device isolation layer, the first ferroelectric pattern is disposed on a top surface and opposite side surfaces of the upper portion of the first active pattern, and the second ferroelectric pattern is disposed on a top surface and opposite side surfaces of the upper portion of the second active pattern.

15. A semiconductor device, comprising:

a substrate comprising a first active region and a second active region;

a first active pattern and a second active pattern disposed in the first and second active regions, respectively;

a first gate electrode and a second gate electrode crossing the first and second active patterns, respectively;

a gate spacer disposed on a side surface of each of the first and second gate electrodes;

a first dielectric pattern and a first ferroelectric pattern, which are interposed between the first gate electrode and the gate spacer; and a second dielectric pattern interposed between the second gate electrode and the gate spacer, wherein the first gate electrode comprises a work function metal pattern including a metal nitride layer and an electrode pattern, and the first ferroelectric pattern is on at least one sidewall of the work function metal pattern and interposed between the first dielectric pattern and the at least one sidewall of the work function metal pattern.

16. The semiconductor device of claim 15, wherein a threshold voltage of a transistor in the first active region is different from a threshold voltage of a transistor in the second active region.

17. The semiconductor device of claim 15, wherein a side surface of the second dielectric pattern is in direct contact with the gate spacer, and an opposite side surface of the second dielectric pattern is in direct contact with the second gate electrode.

18. The semiconductor device of claim 15, further comprising:
- a second ferroelectric pattern interposed between the second gate electrode and the gate spacer,
- wherein a ferroelectric material of the first ferroelectric pattern is different from a ferroelectric material of the second ferroelectric pattern.

19. The semiconductor device of claim 15, further comprising:
- a second ferroelectric pattern interposed between the second gate electrode and the gate spacer,
- wherein a thickness of the first ferroelectric pattern is different from a thickness of the second ferroelectric pattern.

* * * * *